US009459633B2

(12) United States Patent
Geissler et al.

(10) Patent No.: US 9,459,633 B2
(45) Date of Patent: Oct. 4, 2016

(54) MANAGING WORKLOAD DISTRIBUTION AMONG COMPUTING SYSTEMS TO OPTIMIZE HEAT DISSIPATION BY COMPUTING SYSTEMS

(71) Applicant: INTERNATIONAL BUSINESS MACHINES CORPORATION, Armonk, NY (US)

(72) Inventors: Andrew Geissler, Pflugerville, TX (US); Michael C. Hollinger, Round Rock, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 440 days.

(21) Appl. No.: 14/066,996

(22) Filed: Oct. 30, 2013

(65) Prior Publication Data

US 2014/0052311 A1 Feb. 20, 2014

Related U.S. Application Data

(63) Continuation of application No. 13/345,995, filed on Jan. 9, 2012, now Pat. No. 9,176,508.

(51) Int. Cl.
*G05D 23/00* (2006.01)
*G05D 23/19* (2006.01)
(Continued)

(52) U.S. Cl.
CPC .......... *G05D 23/19* (2013.01); *G05D 23/1934* (2013.01); *G06F 9/5094* (2013.01); *H05K 7/20836* (2013.01); *Y02B 60/142* (2013.01)

(58) Field of Classification Search
CPC G05D 23/19; G05D 23/1934; G06F 9/5094; H05K 7/20836; Y02B 60/142
USPC ................................. 700/299, 300
See application file for complete search history.

(56) References Cited

U.S. PATENT DOCUMENTS 4,530,395 A 7/1985 Parker et al.
4,823,290 A 4/1989 Fasack et al.
(Continued)

FOREIGN PATENT DOCUMENTS

JP 02308634 A 8/1989
JP 201174028 A 6/2001

OTHER PUBLICATIONS

Non-final Office Action, mailing date May 22, 2014, U.S. Appl. No. 13/345,995, filed Jan. 9, 2012, In re Geissler, 42 pages.
Notice of Allowance, mailing date Jun. 9, 2015, U.S. Appl. No. 14/058,551, filed Oct. 21, 2013, In re Geissler, 19 pages.
McCreary, H.-Y., et al., "EnergyScale for IBM POWER6 microprocessor-based systems", IBM J. Res. & Dev., vol. 51, No. 6, Nov. 2007, pp. 775-786, 12 pages.
(Continued)

*Primary Examiner* — Mohammad Ali
*Assistant Examiner* — Yuhui R Pan
(74) *Attorney, Agent, or Firm* — Amy J. Pattillo; Damion Josephs

(57) ABSTRACT

A thermal workload distribution controller receives, for each of multiple thermal controlled areas, at least one current thermal measurement from at least one separate thermostat node. The thermal workload distribution controller selects a particular thermal controlled area from among the multiple thermal controlled areas that is most optimal to receive additional heat based on the at least one current thermal measurement received for each of the thermal controlled areas. The thermal workload distribution controller distributes at least one workload to a server node associated with the particular thermal controlled area, wherein the heat dissipated by the server from executing the workload affects a thermal environment of the particular thermal controlled area.

9 Claims, 11 Drawing Sheets

(51) Int. Cl.
*H05K 7/20* (2006.01)
*G06F 9/50* (2006.01)

(56) References Cited

U.S. PATENT DOCUMENTS

| | | | |
|---|---|---|---|
| 4,874,127 | A | 10/1989 | Collier |
| 5,544,697 | A | 8/1996 | Clark |
| 5,801,940 | A | 9/1998 | Russ et al. |
| 6,624,394 | B2 | 9/2003 | Chasen et al. |
| 6,826,456 | B1 | 11/2004 | Irving et al. |
| 6,868,682 | B2 | 3/2005 | Sharma et al. |
| 7,377,450 | B2 | 5/2008 | Van Ostrand et al. |
| 7,721,128 | B2 | 5/2010 | Johns et al. |
| 2003/0110423 | A1* | 6/2003 | Helms ............ G06F 1/206 714/100 |
| 2004/0141542 | A1 | 7/2004 | Sharma et al. |
| 2005/0228618 | A1* | 10/2005 | Patel ............ G06F 9/505 702/188 |
| 2005/0277381 | A1 | 12/2005 | Banerjee |
| 2006/0047808 | A1* | 3/2006 | Sharma ............ G06F 9/505 709/224 |
| 2006/0168975 | A1 | 8/2006 | Malone et al. |
| 2007/0227710 | A1* | 10/2007 | Belady ............ H05K 7/2079 165/122 |
| 2008/0104985 | A1 | 5/2008 | Carlsen |
| 2008/0125915 | A1 | 5/2008 | Berenbaum et al. |
| 2008/0141048 | A1 | 6/2008 | Palmer et al. |
| 2010/0076607 | A1 | 3/2010 | Ahmed et al. |
| 2010/0102136 | A1 | 4/2010 | Hadzidedic et al. |
| 2010/0252233 | A1 | 10/2010 | Absalom |
| 2010/0296915 | A1 | 11/2010 | Suzuki et al. |
| 2011/0100618 | A1 | 5/2011 | Carlson |
| 2012/0016526 | A1 | 1/2012 | Burton |
| 2012/0158190 | A1 | 6/2012 | Belady et al. |
| 2013/0158713 | A1 | 6/2013 | Geissler |
| 2013/0178999 | A1 | 7/2013 | Geissler |
| 2014/0046489 | A1 | 2/2014 | Geissler et al. |

OTHER PUBLICATIONS

Broyles, Martha et al., "IBM EnergyScalefor POWER7 Processor-Based Systems", Apr. 2011, available online at ftp://public.dhe.ibm.com/common/ssi/ecm/en/pow03039usen/POW03039USEN.PDF, pp. 1-66, 66 pages.
Data Aire, Unity Cooling, accessed online as of Dec. 1, 2011 from http://www.dataaire.com/downloads/UnityCooling.pdf, 2 pages.
U.S. Appl. No. 14/058,551, filed Oct. 21, 2013, In re Geissler, International Business Machines Corporation, 37 pages.
Notice of Allowance, mailing date Jun. 30, 2015, U.S. Appl. No. 13/345,995, filed Jan. 9, 2012, In re Geissler, 36 pages.
Non-final Office Action, mailing date Nov. 20, 2014, U.S. Appl. No. 14/058,551, filed Oct. 21, 2013, In re Geissler, 71 pages.
Final Office Action, mailing date Oct. 2, 2014, U.S. Appl. No. 13/325,572, filed Dec. 14, 2011, In re Geissler, International Business Machines Corporation, 55 pages.
Notice of Allowance, mailing date Jun. 5, 2015, U.S. Appl. No. 13/325,572, filed Dec. 14, 2011, In re Geissler, International Business Machines Corporation, 40 pages.
Final Office Action, mailing date Oct. 3, 2014, U.S. Appl. No. 13/345,995, filed Jan. 9, 2012, In re Geissler, 50 pages.
Notice of Allowance, mailing date Apr. 8, 2015, U.S. Appl. No. 13/325,572, filed Dec. 14, 2011, In re Geissler, 45 pages.
Notice of Allowance, mailing date Mar. 11, 2015, U.S. Appl. No. 14/058,551, filed Oct. 21, 2013, In re Geissler, 21 pages.
In Re Gupta, "Thermal Management of Data Centers through Thermal-Aware Job Scheduling", Mobile Computing Research Group, IMPACT, accessed via the Internet at <https://impact.asu.edu/~mcn/DataCenter.htm> as of May 9, 2015, 4 pages.
Notice of Allowance, mailing date Apr. 13, 2015, U.S. Appl. No. 13/345,995, filed Jan. 9, 2012, In re Geissler, 36 pages.
Non-final Office Action, mailing date Apr. 28, 2014, U.S. Appl. No. 13/325,572, filed Dec. 14, 2011, In re Geissler, International Business Machines Corporation, 58 pages.

* cited by examiner though the invention itself, however, as well as a preferred mode of use, further objects and advantages thereof, will best be understood by reference to the following detailed description of an illustrative embodiment when read in conjunction with the accompanying drawings, wherein:

MANAGING WORKLOAD DISTRIBUTION AMONG COMPUTING SYSTEMS TO OPTIMIZE HEAT DISSIPATION BY COMPUTING SYSTEMS

CROSS REFERENCE TO RELATED APPLICATIONS

This application is a continuation of commonly assigned U.S. patent application Ser. No. 13/345,995, filed Jan. 9, 2012, which is hereby incorporated herein by reference.

1. Technical Field

This invention relates in general to control systems for temperature management and more particularly to managing workload distribution among computing systems to optimize heat dissipation by the computing systems.

2. Description of the Related Art

A data center is generally housed in a data center room, or other space, that houses numerous electronic systems. In one example, the electronic systems are arranged in racks and multiple racks are arranged into a row. In another example, the electronic systems are housed in server stacks.

Electronic systems can be configured to house different combinations of components including servers, networking equipment, and storage devices. The components may be embedded in a number of printed circuit (PC) boards, where the PC boards may include a number of subcomponents, such as processors, micro-controllers, video cards, memories and other devices that each dissipate heat during operation.

In a data center room, power is required to run the electronic systems, however, power is also required to remove heat dissipated by the components of the electronic systems. As the number of components in an electronic system and number of electronic systems in a data center room increases, more power is required to remove the heat dissipated by the electronic systems during operation and control the thermal environment in the data center room.

In many data centers a thermal control system, such as a Computer Room Air Conditioning (CRAC) unit, is installed to monitor and maintain the air temperature in the entire room. Separately, each system in the data center room may include one or more fans, each controlled by a separate fan controller that controls fan speeds within electronic systems, to control airflow within each system enclosure.

In addition to data center rooms, electronic systems operating in any location dissipate heat.

BRIEF SUMMARY

In view of the foregoing, there is a need for a method, system, and program product for controlling workloads distributed among computing systems to manage the heat dissipated by computing systems, to minimize the power required for controlling the thermal environment in which a computing system operates and to minimize heating requirements at locations heated by the heat dissipated from the computing system.

In one embodiment, a method for managing distribution of workloads in a computing environment includes a thermal workload distribution controller receiving, for each of multiple thermal controlled areas, at least one current thermal measurement, at least one requested thermal temperature, and a thermal output from at least one separate thermostat node from among a plurality of thermostat nodes via a network. The thermal workload distribution controller selects a particular thermal controlled area from among the plurality of thermal controlled areas that is most optimal to receive additional heat, wherein if at least one first selection of thermal controlled areas from among the plurality of thermal controlled areas comprises the thermal output set to heat and at least one differential between the at least one requested temperature and the at least one particular current temperature for the at least one first selection of thermal controlled areas, wherein the at least one current temperature is lower than the at least one requested temperature, the particular thermal controlled area is set to a first thermal controlled area, from among the at least one first selection of thermal controlled areas, with a largest differential between the at least one requested temperature and the at least one particular temperature for the at least one first selection of thermal controlled areas and if at least one second selection of thermal controlled areas from among the plurality of thermal controlled areas comprises the thermal output set to heat and the at least one request temperature equal to the at least one particular current temperature for the at least one second selection of thermal controlled areas, the particular thermal controlled area is set to a second thermal controlled area, from among the at least one second selection of thermal controlled areas, requiring the greatest amount of heating output as specified in the thermal output. The thermal workload distribution controller distributes at least one workload, from among a plurality of workloads distributed by the thermal workload distribution controller across a plurality of server nodes each associated with one from among the plurality of thermal controlled areas, to at least one server node associated with the particular thermal controlled area from among the plurality of server nodes, wherein the heat dissipated by the at least one server node from executing the workload affects a thermal environment of the particular thermal controlled area. Each separate thermal controller, separately associated with at least one server node from among the plurality of server nodes, receives, for a separate thermal controlled area from among the plurality of thermal controlled areas, at least one current thermal measurement, at least one requested thermal temperature, and a thermal output from the at least one separate thermostat node from among the plurality of thermostat nodes via a network. Each separate thermal controller compares the at least one requested thermal temperature with the at least one current thermal measurement. Each separate thermal controller, in response to determining the at least one requested thermal temperature is greater than the at least one current thermal measurement, votes to increase a processor frequency and voltage on the at least one server node, to unthrottle memory on the at least one server node, and to reduce the fan speed for the at least one server node. Each separate thermal controller, in response to determining the at least one requested thermal temperature is equal to the at least one current thermal measurement: if the thermal output is heat, votes to increase a processor frequency and voltage on the at least one server node, to unthrottle memory on the at least one server node, and to reduce the fan speed for the at least one server node and if the thermal output is cool, votes to increase the fan speed for the at least one server node. Each separate thermal controller, in response to determining the at least one requested thermal temperature is less than the at least one current thermal measurement, votes to reduce the processor frequency and voltage on the at least one server node and to increase the fan speed for the at least one server node.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

As described herein, embodiments of the invention provide a solution for enabling thermal based distribution of workloads, including the movement of cloud-based jobs and resources, within a server cloud to distribute the heat dissipation resulting from servers running the distributed workloads to affect the thermal environment within one or more thermal controlled areas. The distribution of workloads may be within a cloud infrastructure, from cloud environment to cloud environment, from a non-cloud environment to a cloud environment, and from a cloud environment to a non-cloud environment.

In addition, embodiments of the invention provide a solution for enabling individual servers to vote for adjustments to the frequency and voltage of processors, the throttling of memory, the fan speed and the ambient temperature, to manage the heat dissipation from individual servers to affect the thermal environment within one or more thermal controlled areas.

Figure 1:
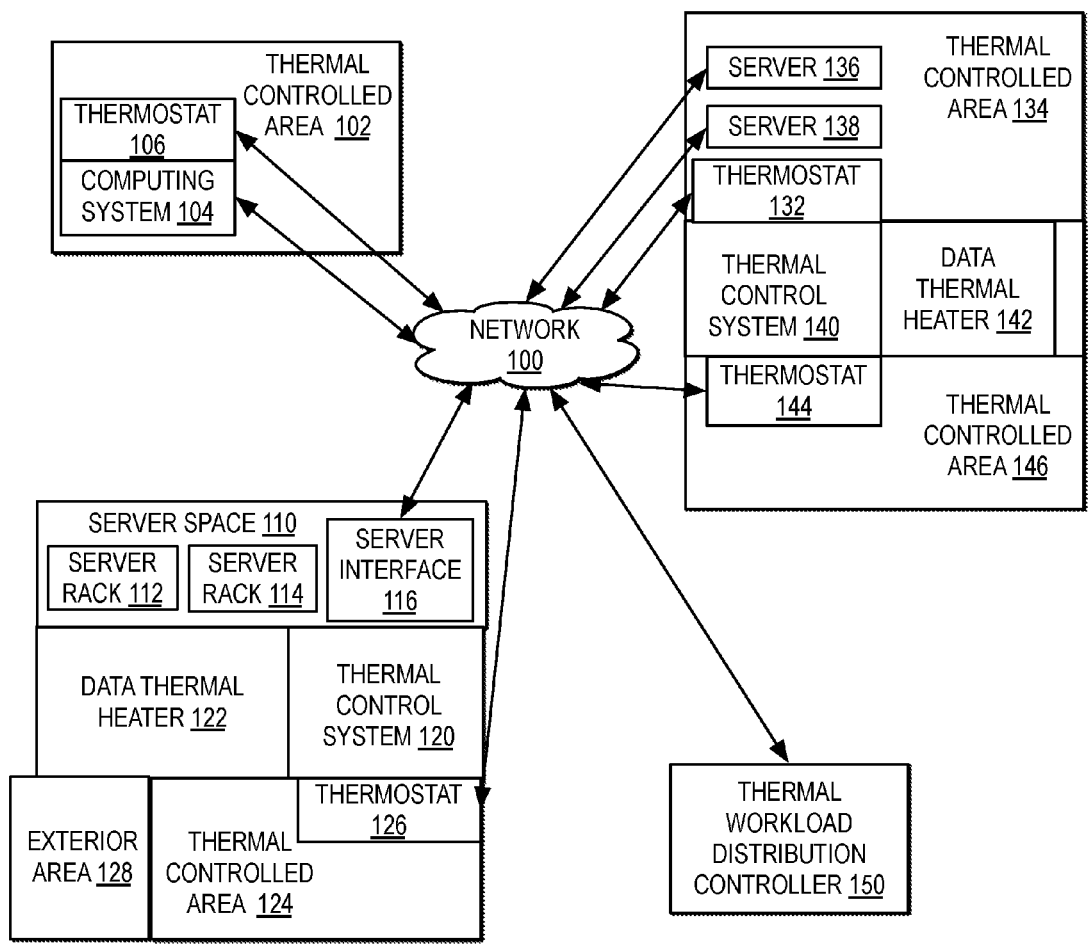
FIG. 1 is a block diagram illustrating one example of a network environment in which workloads are distributed among computing systems to dynamically adjust thermal outputs from computing systems for heating thermal controlled areas associated with the computing systems.

With reference now to the figures, and in particular with reference now to FIG. 1, a block diagram illustrates one example of a network environment in which workloads are distributed among computing systems to dynamically adjust thermal outputs from computing systems for heating thermal controlled areas associated with the computing systems.

A thermal workload distribution controller 150 manages the distribution of available workloads across multiple computing systems via a network 100. Thermal workload distribution controller 150 has knowledge of available workloads and has the ability to trigger or direct migration of workloads within one or more types of network environments or network layers, such as a cloud environment, a grid environment, a cluster environment, and a peer-to-peer network environment. In one example, a workload represents a service or collection of code to be executed and may be measured by the amount of work required for execution. The amount of work required for executing a workload may include the amount of processing, memory usage, network usage, storage usage, and other resource usage. In other examples, a workload may also refer to a partition, an application, a job, an event, or other executable component of at least one task or action. In one example, network 100 represents one or more types of networks, network environments, and network connections that enable connectivity between systems.

In one example, thermal workload distribution controller 150 selects at least one computing system to distribute a workload to from among a computing system 104, a server interface 116 to a server rack 112 of multiple servers and a server rack 114 of multiple servers, a server 136, and a server 138. Computing system 104, server interface 116 to server rack 112 and server rack 114, server 136, and server 138 are illustrative of types of computing systems to which thermal workload distribution controller 150 may select to distribute workloads to for execution. In other embodiments, thermal workload distribution controller 150 may select to distribute workloads to additional or alternate computing systems via network 100.

Thermal workload distribution controller 150 selects which computing systems to distribute workloads to via network 100 based on one or more factors including, but not limited to, current computing system utilization information and the thermal environment of thermal controlled areas associated with computing systems, including the thermal requirements of thermal controlled areas associated with the computing systems and the measured work by thermal control systems to adjust temperatures within thermal controlled areas. Current computing system utilization information may include metrics including, but not limited to, the current loads on each computing system, such as the CPU, memory, and input/output (I/O) loads, the costs associated with each computing system, such as the local energy costs and heating costs, the estimated performance of each computing system, and the actual performance of each computing system.

In the example, a thermostat is positioned to record temperatures and thermal output by each thermal control system in each thermal controlled area and to report the current and requested temperatures and thermal output by each thermal control system in each thermal controlled area to thermal workload distribution controller 150. Thermal workload distribution controller 150 identifies one or more computing systems to distribute workloads to, where by distributing the workloads to the selected computing systems, the selected computing systems will dissipate heat when processing the workloads and the dissipated heat by the selected computing systems will contribute to increasing the current temperature in a thermal controlled area to a requested temperature for the thermal controlled area. In another example, thermal workload distribution controller 150 identifies one or more computing systems to distribute workloads to, where by distributing the workloads to the selected computing systems, other computing systems will handle fewer workloads and dissipate less heat, to decrease the amount of air conditioning required to cool a thermal controlled area included in the other computing systems, based on the reported thermal outputs.

In the example, thermal controlled areas associated with computing systems may include thermal controlled areas in which the computing systems reside, such as a thermal controlled area 102 and a thermal controlled area 134, and thermal controlled areas separate from the area in which the computing systems reside, but which are heated by a data thermal heater adapted to heat the thermal controlled area in whole or in part through the heat dissipated by the computing systems, such as a thermal controlled area 124 and a thermal controlled area 146. Each thermal controlled area as described herein may be defined by one or more physical boundaries, such as walls, or may represent an area of space without physical boundary.

In one example, computing system 104 resides within thermal controlled area 102, such that thermostat 106 effectively monitors the thermal environment of thermal controlled area 102. Thermal controlled area 102 may represent an area surrounding computing system 104 that is impacted by the heat dissipated by computing system 104, where computing system 104 functions as both a computing system and as a thermal control system within thermal controlled area 102. In one example, thermal controlled area 102 may represent a room or closet that includes computing system 104 or a space within an office cubicle that includes computing system 104. In the example, thermostat 106 may represent a hardware and software component integrated within computing system 104 or within a separate unit from computing system 104. Thermostat 106 measures ambient temperatures in thermal controlled area 102, measures operating temperatures within computing system 104 and automatically adjusts the operation of computing system 104 if the measured temperatures are higher or lower than threshold operating temperatures specified for the components of computing system 104. In addition, in the example, a user may set a requested temperature for thermal controlled area 102 through thermostat 106, where computing system 104, as directed by thermostat 106, may adjust operations to increase or decrease the heat dissipated by computing system 104 to adjust the actual temperature within thermal controlled area 102 to meet the requested temperature. In addition, in the example, where computing system 104 represents the thermal control system, thermostat 106 may measure the amount and type of thermal related output by computing system 104 over a measurement period. In the example, thermostat 106 reports the current temperature, requested temperature, and thermal related output for thermal controlled area 102 to thermal workload distribution controller 150, computing system 104 reports the computing utilization information to thermal workload distribution controller 150, and thermal workload distribution controller 150 determines whether to distribute additional workloads to computing system 104 based on the reported information.

In another example, server 136 and server 138 reside within thermal controlled area 134, such as a data center room, monitored by a thermostat 132. Thermostat 132 reads a current ambient temperature within thermal controlled area 134, compares the current ambient temperature with a requested temperature for thermal controlled area 134, and directs a thermal control system 140 to adjust thermal output into thermal controlled area 134 to adjust the current ambient temperature to match the requested temperature. In the example, where thermal controlled area 134 represent a data center room, the requested temperature for thermostat 132 may represent an ambient temperature set point that is set to a temperature based on the ambient temperature requirements or votes and operational temperature requirements of components of server 136 and server 138. In the example, thermal control system 140 may include one or more cooling elements and one or more heating elements. Thermostat 132 measures the amount and type of output from thermal control system 130 over a period of time, where the amount of output may represent a measurable unit representative of the power required and where the type of output may represent either heat output or cooling output.

In addition, in the example, thermal controlled area 146 is separate from the area in which servers 136 and server 138 reside, but thermal controlled area 146 is heated by a data thermal heater 142 adapted to heat thermal controlled area 146 in whole or in part through the heat dissipated by server 136 and server 138. In the example, a thermostat 144 monitors the current temperature in thermal controlled area 146, compares the current temperature with a requested temperature for thermal controlled area 146, and directs thermal control system 140 to adjust thermal output into thermal controlled area 146 to adjust the current ambient temperature to match the requested temperature.

In the example, data thermal heater 142 is adapted to convert or transfer heat dissipated by server 136 and server 138 in thermal controlled area 134 into heat output in thermal controlled area 146. In one example, data thermal heater 142 may include coils or pipes that are heated, in whole or in part, by the heat dissipated by server 136 and server 138. In another example, data thermal heater 142 may include fans, which move heat dissipated by server 136 and server 138 into thermal controlled area 146. In another example, data thermal heater 142 may represent vents or ducts through which heat dissipated in thermal controlled area 134 rises to heat thermal controlled area 146. Thermostat 132 measures the amount and type of output from thermal control system 140 over a period of time.

As illustrated, servers 136 and 138 may operate in thermal controlled area 134, the temperature of which is controlled by thermal control system 140, and may also dissipate heat, which is converted or transferred by thermal control system 140 into thermal controlled area 146 to control the temperature in thermal controlled area 146. In the example, thermostat 132 reports the current temperature, requested temperature and amount and type of thermal output by thermal control system 140 for thermal controlled area 134 to thermal workload distribution controller 150 and thermostat 144 reports the current temperature, requested temperature and amount and type of thermal output by thermal control system 140 for thermal controlled area 146. Thermostat 132 and thermostat 144 may separately measure the thermal output by thermal control system 140 specified for thermal controlled area 134 and thermal controlled area 146 or may measure the cumulative thermal output by thermal control system 140 for both thermal controlled area 134 and thermal controlled area 146. Servers 136 and 138 each report server utilization information to thermal workload distribution controller 150. In the example, thermal workload distribution controller 150 may determine whether to distribute additional workloads to server 136 and server 138 by considering the reports by thermostat 132 and thermostat 144 separately or by considering the reports by thermostat 132 and thermostat 144 in combination to minimize the amount of power required to maintain temperatures in one or both of thermal controlled area 134 and thermal controlled area 146.

In another example, thermal controlled area 124 is separate from a server space 110 in which server rack 112 and server rack 114 reside, but thermal controlled area 124 is heated by a data thermal heater 122 adapted to heat thermal controlled area 124 in whole or in part through the heat dissipated from server space 110. In the example, a thermostat 126 monitors the current temperature in thermal controlled area 124, compares the current temperature with a requested temperature for thermal controlled area 124, and directs a thermal control system 120 to adjust the amount and type of output into thermal controlled area 124 to adjust the current ambient temperature to match the requested temperature. In the example, thermal control system 120 may include one or more cooling elements and one or more heating elements, including data thermal heater 122. In the example, data thermal heater 122 is adapted to convert or transfer heat dissipated from server space 110 into heat output in thermal controlled area 124. In addition, in the example, data thermal heater 122 is adapted to output heat dissipated by server space 110 to an exterior area 128, if all or a portion of the heat dissipated by server space 110 is not needed to heat thermal controlled area 124. For example, if server space 110 is positioned in the basement of a building to dissipate heat into an existing heat furnace system in a building for heating thermal controlled area 124, data thermal heater 122 may direct all or a portion of the dissipated heat to exterior area 128, outside the building, when the heat is not needed for thermal controlled area 124, such as during warmer months when the furnace is not operated. In addition, in the example, if server space 110 is positioned in the basement of a building that does not include air conditioning, server interface 116 may detect when the temperatures within server space 110 exceed allowable operating temperatures for server rack 112 and server rack 114 during warmer months and report to thermal workload distribution controller 150 that server rack 112 and server rack 114 are not available during times when heat dissipation alone through data thermal heater 122 is insufficient to adjust the ambient temperature in server space 110 to a safe operating temperature for server rack 112 and server rack 114. In the example, thermostat 125 also measures the amount and type of output from thermal control system 120 and reports the requested temperatures, actual temperatures, and thermal output for thermal controlled area 124 to thermal workload distribution controller 150. Server interface 116 reports server utilization information for server rack 112 and server rack 114 to thermal workload distribution controller 150. Thermal workload distribution controller 150 determines whether to send workloads to server interface 116 based on the reports from thermostat 126 and server interface 116.

While in the example, multiple configurations of computing systems associated with thermal controlled areas and thermal control systems for controlling temperatures in thermal controlled areas are illustrated, in additional or alternate embodiments, additional or alternate embodiments of computing systems, thermal controlled areas, and thermal control systems may be implemented. In addition, while in the example multiple thermostats and computing systems are illustrated for reporting temperatures and workloads to thermal workload distribution controller 150, in additional or alternate embodiments, additional or alternate embodiments of thermostats and computing systems for reporting temperatures and workloads to thermal workload distribution controller 150 may be implemented.

In the example, each of computing system 104, server rack 112, server rack 114, server 136, and server 138 include one or more components, which when operating, contribute to the overall heat dissipation of each computing system. For example, when components such as processors, memory, and disk drives operate, the thermal energy of each component builds, and thus the heat dissipated by each component, increases. Each component of a computing system may specify a minimum and maximum operating temperature and each computing system specify a minimum and maximum ambient temperature.

In addition to controlling heat dissipation by computing systems by controlling the distribution of workloads to computing systems through thermal workload distribution controller 150, each computing system may also control variables that contribute to the amount of heat dissipated by the computing system. For example, by increasing or decreasing the frequency and voltage settings of a microprocessor, such as by dynamic frequency scaling (e.g. CPU throttling) and dynamic voltage scaling (e.g. overvolting or undervolting), the amount of heat dissipated by the microprocessor increases or decreases, along with increasing or decreasing the performance of the processor. In another example, by unthrottling or throttling memory, the amount of heat dissipated by memory increases or decreases. In addition, during operation of components, such as fans for controlling airflow through computing systems, as the speed of a fan increases, exhaust air temperatures may decrease, and as the speed of the fan decreases, exhaust air temperatures may increase.

In one example, each computing system may receive current temperatures for components and a current ambient temperature of the area in which the computing system operates, determine the optimal settings for one or more of the processor voltage and frequency, memory throttling, fan speed, and ambient temperature to operate within the minimum and maximum temperature settings for individual components of the computing system and the minimum and maximum ambient temperature settings for the computing system. In addition, each computing system may receive the current and requested temperatures and thermal output from thermostats and determine the optimal settings for one or more of the processor voltage and frequency, memory throttling, fan speed, and ambient temperature to also increase or decrease the heat dissipation by the computing system in view of the current and requested temperatures and thermal output.

In one example, thermal controllers within computing systems may send ambient temperature votes to thermal control systems, such as thermal control system 120 and thermal control system 140, for controlling the temperature within a thermal controlled area. In one example, the thermal control system sets the requested temperature for the thermal controlled area from the ambient temperature vote or uses the ambient temperature vote as a limit for the minimum or maximum temperature for setting the requested temperature for a thermal controlled area.

By thermal workload controller distribution controller 150 selecting where to distribute workloads among computing systems to impact the thermal energy at computing systems and by each computing system adjusting one or more thermal factors to control the amount of heat dissipated by the computing system when executing a workload, heat dissipation by computing systems is optimized at a network and system level. At a network level, in a cloud environment or other network environment that facilitates secure workload distribution across computing systems connected to a network, thermal workload distribution controller 150 may dynamically control the distribution of workloads to any location, worldwide, where heating a thermal controlled area through heat dissipation by computing systems reduces the load on a thermal control system for the thermal controlled area. In addition, at a system level, thermal controllers within computing systems may dynamically control the amount of heat dissipated when handling workloads to optimize the heat dissipation by computing systems for a thermal controlled area and reduce the load on a thermal control system for the thermal controlled area.

Figure 2:
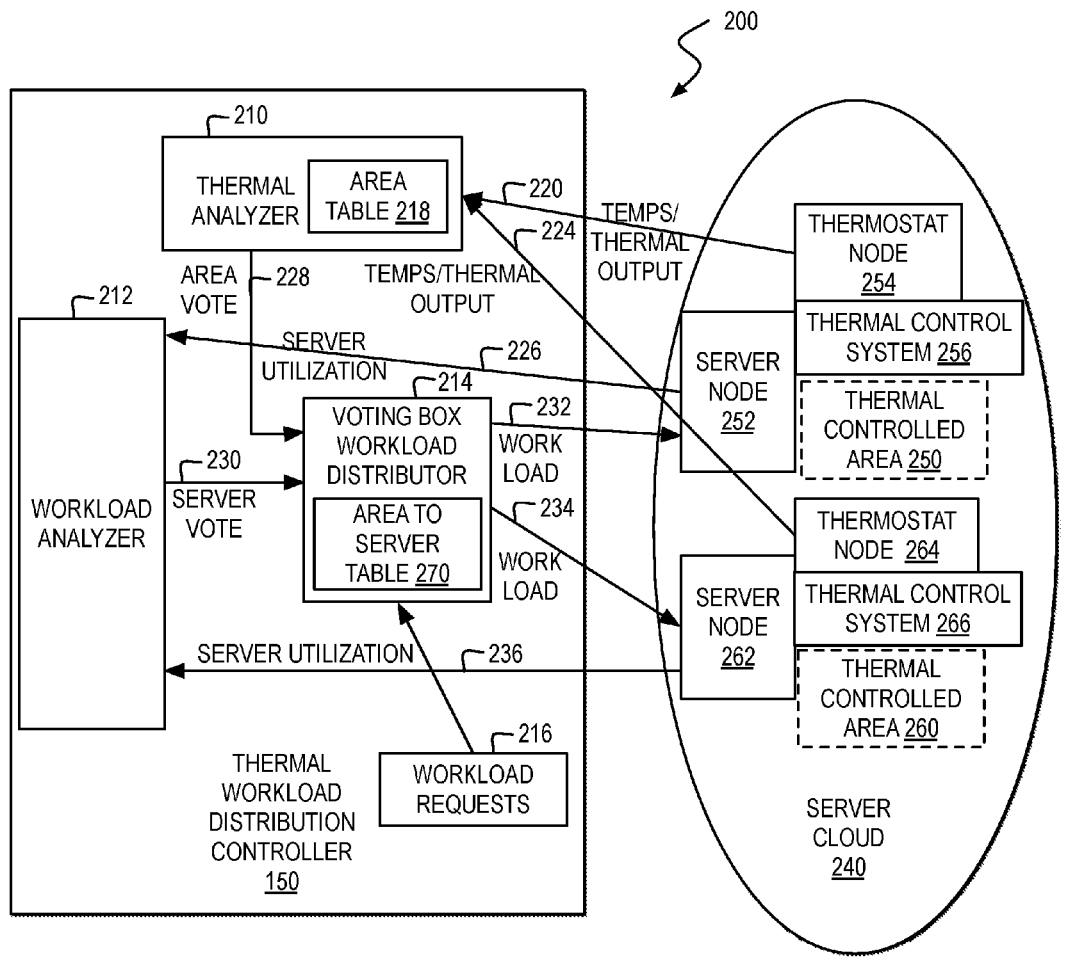
FIG. 2 is a block diagram illustrating one example of a thermal workload distribution environment.

With reference now to FIG. 2, a block diagram illustrates one example of a thermal workload distribution environment. In the example, a thermal workload distribution environment 200 includes thermal workload distribution controller 150 comprising multiple services or functions including, but not limited to, a thermal analyzer 210, a workload analyzer 212, and a voting box workload distributor 214. Thermal workload distribution environment 200 also includes a server cloud 240 including multiple cloud nodes. In the example, a server node 252 includes one or more computing systems and a thermostat node 254 monitors a thermal controlled area 250 associated with server node 252. In addition, in the example, a server node 262 includes one or more computing systems and a thermostat node 264 monitors a thermal controlled area 260 associated with server node 262.

In the example, server node 252 and server node 262 may reside in thermal controlled area 250 and thermal controlled area 260, respectively, or thermal controlled area 250 and thermal controlled area 260 may be heated in whole or in part by heat dissipated by server node 252 and server node 262, which reside in a separate area. In the example, a thermal control system 256 and a thermal control system 266 each control thermal outputs, of an amount and type, to maintain the current temperatures within thermal controlled area 250 and thermal controlled area 260, respectively, at requested temperatures. Each of thermal control system 256 and thermal control system 266 may also represent nodes within server cloud 240.

Each thermostat outputs at least one current thermal measurement including, but not limited to, a current temperature, a requested temperature, and the amount and type of thermal output by a thermal control system for a thermal controlled area. In the example, as illustrated at reference numeral 220, thermostat node 254 reports current temperatures, requested temperatures, and the amount and type of thermal output by thermal control system 256, for thermal controlled area 250, to thermal analyzer 210 and as illustrated at reference numeral 224, thermostat node 264 reports current temperatures, requested temperatures, and the amount and type of thermal output by thermal control system 266, for thermal controller area 260, to thermal analyzer 210. In addition, in the example, as illustrated at reference numeral 226, server node 252 reports server utilization information to workload analyzer 212 and as illustrated at reference numeral 236, server node 262 reports server utilization information to workload analyzer 212. The server utilization information may include, but is not limited to, server resource use, server resource availability, server performance, server costs, and other server utilization metrics.

In the example, thermal analyzer 210 receives the requested temperatures, current temperatures, and thermal outputs for multiple thermal controlled areas. Thermal analyzer 210 stores the received temperatures and thermal outputs for each area in an area table 218. Thermal analyzer 210 selects one or more thermal controlled areas to vote for to receive a next workload, as illustrated at reference numeral 228 by an area vote. In addition, workload analyzer 212 receives server utilization information from multiple servers and selects one or more servers to vote for to receive a next workload, as illustrated at reference numeral 230 by a server vote.

Voting box workload distributor 214 receives area votes from thermal analyzer 210 and receives server votes from workload analyzer 212. Voting box workload distributor 214 selects one or more server nodes from among the area votes and server votes to handle one or more workload requests 216. Voting box workload distributor 214 may apply a configured prioritization value in selecting whether to prioritize utilization versus temperature in selecting between the area votes from thermal analyzer 210 and the server votes from workload analyzer 212, where the configured prioritization value is configurable to specify the priority for sending workloads to the lowest utilized server nodes versus sending workloads to the server nodes that will supply heat to the thermal controlled areas that need the most heat. In one example, the configurable prioritization value is configurable along a sliding bar from 1 to 100, where a user configures the prioritization value along the sliding bar between 1 and 100. On the sliding bar, for a configured value of 50, or the middle of the sliding bar, in one example, voting box workload distributor 214 selects a thermal controlled area with a current temperature that is one degree or more below a requested temperature, if included in the area votes, otherwise voting box workload distributor 214 selects an underutilized server node in the server votes. In another example, on the sliding bar, for a configured value of 1, representing a maximum priority for server utilization, voting box workload distributor 214 will always select the server vote from workload analyzer 212. In another example, on the sliding bar, for a configured value of 100, representing a maximum priority for thermal area votes, voting box workload distributor 214 will always select the area vote from thermal analyzer 210.

In one example, thermal analyzer 210 reports an area vote identifying one or more servers associated with the area. In another example, voting box workload distributor 214 maintains an area to server table 270 identifying the one or more server nodes associated with each thermal controlled area. Voting box workload distributor 214 converts selected area votes into specific server node identifiers using the area to server table 270. For example, area to server table 270 identifies server node 252 as associated with thermal controlled area 250 and identifies server node 262 as associated with thermal controlled area 260.

Voting box workload distributor 214 directs migration, dynamic allocation, or any other type of movement of the workloads selected from workload requests 216, to the selected server node. As illustrated at reference numeral 232, voting box workload distributor 214 may migrate a workload to server node 252. In addition, as illustrated at reference numeral 234, voting box workload distributor 214 may migrate a workload to server node 262. In one example, voting box workload distributor 214 may direct migration of workloads by one or more management services for controlling the migration of workloads specified in workload requests 216, to server nodes in server cloud 240.

Returning to thermal analyzer 210, thermal analyzer 210 may apply one or more policies for determining which one or more thermal controlled areas to vote for to receive the next workload. In one example, thermal analyzer 210 may apply a policy that searches through the temperatures and thermal outputs reported for each thermal controlled area and identifies the area that either most needs additional heat, to which additional workloads should be directed to run on servers that dissipate heat for the area, or the area that least needs the additional heat, to which additional workloads should be directed away from.

In one example, thermal analyzer 210 first compares the current temperature and requested temperature for each thermal controlled area. If thermal analyzer 210 identifies at least one thermal controlled areas with lower current temperatures than requested temperatures, thermal analyzer 210 votes for the thermal controlled area with the largest differential between the lower current temperature and the requested temperature as area vote 228. By voting for the area with the largest differential between a lower current temperature and requested temperature, thermal analyzer 210 selects to vote to send workloads to the server node associated with a thermal controlled area that needs additional heat to raise the current temperature to meet the requested temperature by increasing the heat dissipated by the server node handling the workload.

In another example, in the event thermal analyzer 210 does not identify any area with a lower current temperature than requested temperature, if thermal analyzer 210 identifies at least one thermal controlled area with a current temperature matching a requested temperature, thermal analyzer 210 removes any areas where the type of output was cooling, to avoid adding additional workloads to areas requiring cooling output. Among the areas with a current temperature matching a requested temperature, if any of the areas used heating output, then thermal analyzer 210 votes for the area with the greatest amount of heating output as area vote 228. By voting for the area that is using the greatest amount of heat output to maintain the current temperature matching the requested temperature, thermal analyzer 210 selects to vote to send workloads to the server node associated with a thermal controlled area that with a thermal control system that is outputting the most heat to keep the current temperature matching the requesting temperature, to reduce the output requirements of the thermal control system by increasing the heat dissipated by the server node handling the workload.

In another example, in the event thermal analyzer 210 does not identify any area with a current temperature matching the requested temperature, thermal analyzer 210 identifies, among the locations where the current temperature exceeds the requested temperature, which area reports the lowest amount of cooling output over a previous time period and votes for the area with the lowest amount of cooling output as area vote 228. If all the areas report a higher current temperature than requested temperature, by voting for the area that is using the least amount of cooling output to reduce the current temperature, thermal analyzer 210 effectively selects to vote to send workloads away from the server nodes heating the areas currently requiring the most cooling output to reduce current temperatures to meet required temperatures.

In the example, each of thermostat node 254 and thermostat node 264 may represent one or more thermostat controllers permanently or temporarily affixed to monitor temperatures within thermal controlled area 250 and thermal controlled area 260. In one example, thermostat node 254 and thermostat node 264 may each communicatively connect within server cloud 240 and to thermal control system 256 and thermal control system 266 through local wireless connections. In one example, the thermostat boxes, representing thermostat node 254 and thermostat node 264, are portable thermostat boxes that can be moved to different positions within thermal controlled area 250 and thermal controlled area 260, to enable a user to specify a portion of thermal controlled area within which the current temperature should be measured by the thermostat box.

As will be further described with reference to FIGS. 6, 7, and 8, server cloud 240 may represent a server cloud environment with multiple cloud nodes, and each of server node 252, thermostat node 254, server node 262, and thermostat node 264 may each represent one or more cloud nodes. In the example, thermal workload distribution controller 150, and in particular, each of workload analyzer 212, thermal analyzer 210, and voting box workload distributor 214, may represent one or more management functions within a cloud environment, and one or more cloud nodes may support each management function.

Figure 3:
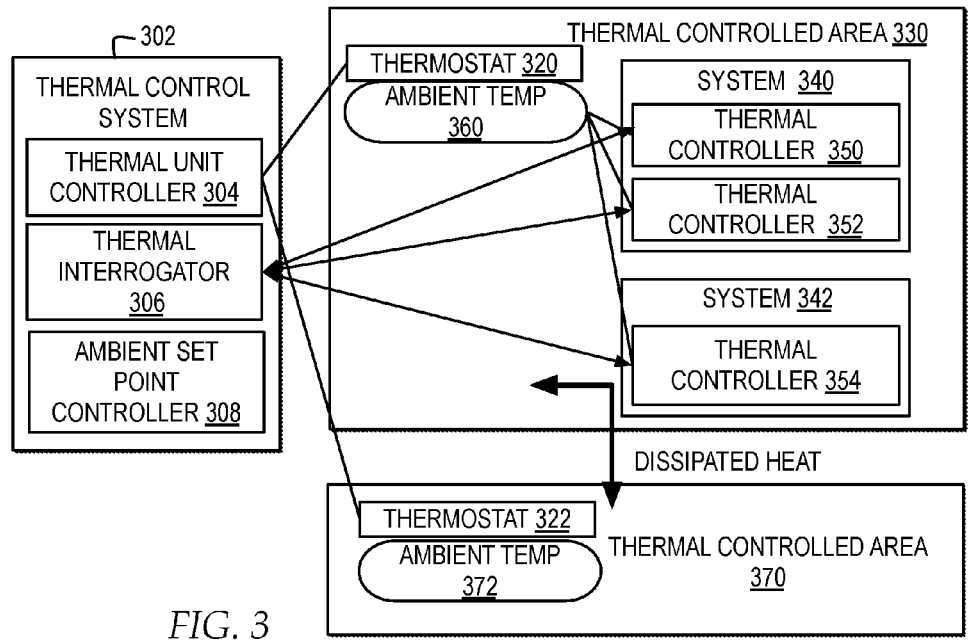
FIG. 3 is a block diagram illustrating one example of a thermal control system for monitoring and maintaining the temperatures in thermal controlled areas and multiple thermal controllers for controlling the voltage and frequency of processors, memory throttling, and fan speeds of multiple fans within one or more systems, where the thermal control system and the thermal controllers are independent systems that are integrated for optimizing the overall energy efficiency of the thermal infrastructure of thermal controlled areas.

Referring now to FIG. 3, a block diagram illustrates one example of a thermal control system for monitoring and maintaining the temperatures in thermal controlled areas and multiple thermal controllers for controlling the voltage and frequency of processors, memory throttling, and fan speeds of multiple fans within one or more systems, where the thermal control system and the thermal controllers are independent systems that are integrated for optimizing the overall energy efficiency of the thermal infrastructure of thermal controlled areas.

In the example, the thermal infrastructure of a thermal controlled area 330 and a thermal controlled area 370 includes a thermal control system 302 and thermal controllers 350, 352, and 354. Each of thermal control system 302 and thermal controllers 350, 352, and 354 are illustrated as independent systems, but thermal control system 302 is integrated with thermal controllers 350, 352, and 354 to optimize the overall energy efficiency of the thermal infrastructure of thermal controlled area 330 and thermal controlled area 370.

In the example, each thermal controlled area includes a separate thermostat that measures the ambient temperature within the thermal controlled area, records a requested temperature for the thermal controlled area, calculates the difference between the ambient temperature and requested temperature, directs thermal unit controller 304 to adjust the thermal output within the thermal controlled area to adjust the ambient temperature to match the requested temperature, and records the thermal output of thermal unit controller 304. For example, thermal controlled area 330 includes a thermostat 320 and thermal controlled area 370 includes a thermostat 322.

In the example, thermal control system 302 and thermal controllers 350, 352, and 354 are considered independent systems in that each system may operate as an independent functional unit separate from, and independent of, any other system, but interdependent in that thermal control system 302 and thermal controllers 350, 352, and 354 operate in an inversely proportional relationship. In the example, thermal control system 302 and thermal controllers 350, 352, and 354 are considered integrated in that thermal controllers 350, 352, and 354 report ambient temperature votes to thermal control system 302 and thermal control system 302 may adjust an ambient temperature set point for thermal controlled area 330 based on the ambient temperature votes.

In the example, thermal control system 302 includes a thermal unit controller 304 for controlling one or more heating units or one or more cooling units that manage air temperatures, airflow, and humidity room-wide within at least one of thermal controlled area 330 and thermal controlled area 370. In one example, thermal unit controller 304 may include separate heating and cooling units for each of thermal controlled areas 330 and 370. In another example, thermal unit controller 304 may implement a cooling unit for thermal controlled area 330 and a heating unit for thermal controlled area 370.

In the example, thermal controlled area 330 includes multiple systems, illustrated as systems 340 and 342. Systems 340 and 342 each represent at least one component that dissipates heat and may represent multiple components, such as a rack of components, a row of multiple racks of components, a stack in a server, or other combinations of components. Components within systems may include, but are not limited to, processors, input/output devices, hubs, disk drives, memory, adapters, buses, and other hardware elements of a system. In the example, thermal controlled area 370 does not include any computing systems that report to thermal control system 302.

In the example, systems 340 and 342 may each include at least one fan, and at least one fan controller for controlling the fan speed to locally control air flow within a system, including pulling in cooler air output by thermal control system 302 into thermal controlled area 330 and blowing heated air out of the system through an exhaust vent or other opening. For example, system 340 includes a thermal controller 350 and a thermal controller 352, where each of thermal controller 350 and thermal controller 352 control fan speeds within system 340 for locally controlling airflow within system 340. In another example, system 342 includes a thermal controller 354, where thermal controller 354 controls fan speeds within system 342 for locally controlling airflow within system 342. In addition, each of thermal controller 350, thermal controller 352, and thermal controller 354 may control the processor voltage and frequency and memory throttling within system 340 and system 342, respectively.

In the example, a thermal interrogator 306 of thermal control system 302 is communicatively connected to receive inputs from each of thermal controllers 350, 352, and 354. In the example, each of thermal controllers 350, 352, and 354 are integrated with thermal control system 302 by reporting ambient temperature votes to thermal interrogator 306. Thermal interrogator 306 records the ambient temperature votes from the thermal controllers 350, 352, and 354. An ambient set point controller 308 of thermal control system 302 selects an ambient temperature set point for thermal controlled area 330 based on the ambient temperature votes received from the thermal controllers, and may further select a separate ambient temperature set point for thermal controlled area 370. Thermal unit controller 304 receives the ambient temperature set point from ambient set point controller 308, detects one or more ambient temperatures from one or more locations within thermal controlled area 330, such as ambient temperature 360 in thermal controlled area 330 and ambient temperature 372 in thermal controlled area 370, and adjusts the thermal output by one or more cooling or heating units to adjust the ambient temperatures in thermal controlled area 330 and thermal controlled area 370 to meet the ambient temperature set points set by ambient set point controller 308.

In one example, the ambient temperature set point is the requested temperature for a thermal controlled area. In another example, the ambient temperature set point represents a minimum or maximum limit for the requested temperature for a thermal controlled area. Thermostat 320 and thermostat 322 may each include an interface through which a user or temperature monitoring application may adjust the requested temperature for each of thermal controlled area 330 and thermal controlled area 370, respectively. Thermostat 320 and thermostat 322 report requested temperatures to thermal interrogator 306.

For each of thermal controllers 350, 352, and 354 to specify an ambient temperature vote, each of thermal controllers 350, 352, and 354 receives multiple temperature inputs, including component temperatures proximate to one or more components and an ambient temperature. Each of thermal controllers 350, 352, and 354 compares the multiple temperature inputs with one or more set points for a component or system and votes for each of a fan speed for controlling a fan, a processor frequency and voltage for controlling one or more processors, a memory throttling setting for controlling the thermal energy generated in the memory components, and an ambient temperature for sending to thermal control system 302. For example, each of thermal controllers 350, 352, and 354 may receive an ambient temperature input of ambient temperature 360 indicating the air temperature in thermal controlled area 330. In one example, ambient temperature 360 is periodically measured by a system service processor (SSP), comprising hardware and firmware, for controlling a platform of system 340, and ambient temperature 360 is forwarded to thermal controllers 350 and 352, which represent fan control logic in the SSP firmware. In another example, ambient temperature 360 is periodically measured by thermostat 320 and forwarded to thermal controllers 350 and 352.

By thermal interrogator 306 collecting ambient temperature votes from each thermal controller and collecting a requested temperature for thermal controlled area 370 from thermostat 322, ambient set point controller 308 selects an ambient temperature set point for thermal controlled area 330 based on the ambient temperature votes from the thermal controllers and based on the requested temperature for thermal controlled area 370, in coordination with fan, processor, and memory settings by thermal controllers 350, 352, and 354, for optimizing use in view of the inversely-proportional relationship of thermal control system 302 and the fan control of thermal controllers 350, 352, and 354. For example, in view of the inversely-proportional relationship of thermal control system 302 and thermal controllers 350, 352, and 354, an inefficient use of the systems may occur if thermal control system 302 is aggressively cooling, but all the fans are off or if all the fans are spinning rapidly, but thermal unit controller 304 is off. By ambient set point controller 308 setting an ambient temperature set point for thermal controlled area 330 based on ambient temperature votes from thermal controllers 350, 352, and 354, although thermal control system 302 runs independently of thermal controllers 350, 352, and 354, thermal control system 302 will more efficiently run in relation to thermal controllers 350, 352, and 354. In addition, by ambient set point controller 308 setting an ambient temperature set point for thermal controlled area 330 based on the requested temperature for thermal controlled area 370, thermal control system 302 will more efficiently run to control the temperatures in both thermal controlled area 330 and thermal controlled area 370.

Figure 4:
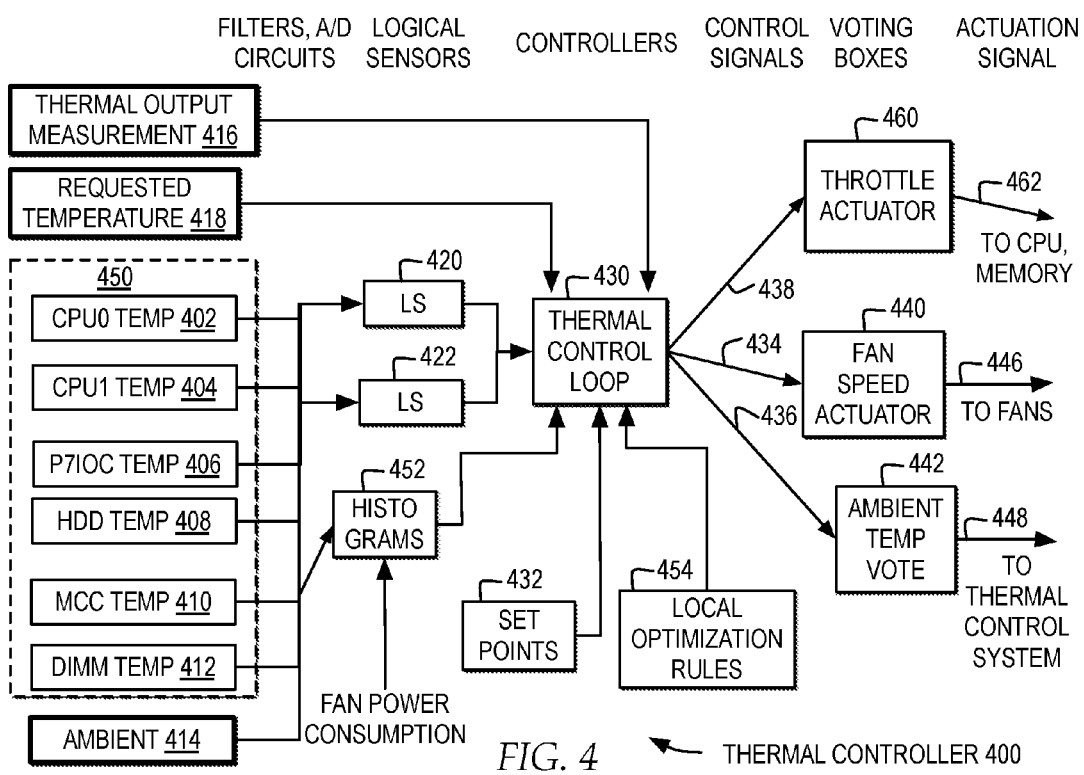
FIG. 4 is a block diagram illustrating one example of a thermal controller for controlling a fan speed of a fan within a system within a data center room, for controlling a processor voltage and frequency and memory throttling, and for sending an ambient temperature vote to a thermal control system that separately controls thermal outputs in a thermal controlled area.

Referring now to FIG. 4, a block diagram illustrates one example of a thermal controller for controlling a fan speed of a fan within a system within a data center room, for controlling a processor voltage and frequency and memory throttling, and for sending an ambient temperature vote to a thermal control system that separately controls thermal outputs in a thermal controlled area.

In the example, a thermal controller 400 may access temperatures from one or more thermal sensors that include component temperatures 450 and an ambient temperature 414. Component temperatures 450 may include, for example, processor temperatures, such as CPU0 temp 402 and CPU1 temp 404, input/output (I/O) hub temperatures, such as IO Hub temp 406, disk drive temperatures, such as hard disk drive (HDD) temp 408, and memory temperatures, such as memory chip controller (MCC) temp 410 and dual in-line memory module (DIMM) temp 412. One of ordinary skill in the art will appreciate that additional or alternate component temperatures may be detected.

In the example, thermal controller 400 may include one or more logical sensors, such as logical sensor 420 and logical sensor 422, that are firmware representations of the physical sensors being monitored from among the sensors monitoring component temperatures 450 and ambient temperature 414, through filters and circuits. In the example, logical sensors 420 and 422 filter the logical temperature measurements and pass logical temperature measurements to a thermal control loop 430. In another embodiment, additional or alternate logical sensors may be implemented.

In addition, in the example, thermal controller 400 may access a thermal output measurement 416, including the type and amount of thermal output by a thermal control system, and a requested temperature 418 for a thermal controlled area. In one example thermal controller 400 accesses thermal output measurement 416 and requested temperature 418 from a thermostat or thermal control system for a thermal controlled area.

Thermal control loop 430 receives set points 432, specifying one or more set points of required temperatures within a system, by component, or for a group of components. The required temperatures within a system may include minimum temperatures, maximum temperatures, and desired temperatures and may also specify a component with the highest maximum temperature within a system.

In the example, thermal control loop 430 compares the current temperatures provided by logical sensors 420 and 422, and requested temperature 418 and thermal output measurement 416, with set points 432 and calculates at least one fan speed, at least one setting for processors and memory, and at least one ambient temperature vote. Thermal control loop 430 may implement one or more optimization rules, illustrated as local optimization rules 454, for calculating each fan speed and each processor and memory setting and determining each ambient temperature vote to optimize power consumption for local component cooling and to optimize the overall heat dissipation by the system. Examples of local optimization rules 454 for calculating fan speeds, processor and memory settings, and ambient temperature votes for local optimization and overall heat dissipation by the system include, but are not limited to, use of lookup tables, modeling of and use of fan power consumption, processor voltage and frequency consumption metrics, and throttling consumption metrics, and modeling and use of on real fan power consumption and real throttling metrics. In one example, thermal controller 400 may record and analyze component temperatures 450, ambient temperature 414, thermal output measurements 416, and requested temperature 418 over time. Because thermal control loop 430 receives ambient temperature 414, requested temperature 418, and thermal output measurements 416, thermal control loop 430 may optimize fan speeds, processor frequency and voltage, and component throttling not only based on current component temperatures and histograms, but also based on the ambient temperature within the room, the requested temperature of a thermal controlled area, and the current thermal outputs by a thermal control system.

Thermal control loop 430 outputs each calculated fan speed as fan control signal 434 to a fan speed actuator 440, outputs each calculated throttle setting for CPU and memory as control signal 438 to a throttle actuator 460, and outputs each ambient temperature vote as an ambient control signal 436 to an ambient temperature voting box 442. In one example, thermal controller 400 may include additional control loops, such as a power control loop and a performance control loop, for calculating fan speeds and throttle settings to meet power and performance set points. The power control loop and performance control loops may also submit fan speeds to fan speed actuator 440, throttle settings to throttle actuator 460, and ambient control signals to ambient temperature voting box 442. Fan speed actuator 440, throttle actuator 460, and ambient temperature voting box 442 each select the minimum or maximum control signal from among multiple control signals received from multiple control loops. In one example, thermal control loop 430 outputs fan control signal 434 to fan speed actuator 440 of 2000 RPM, but a performance control loop outputs a fan control signal to fan speed actuator 440 of 4000 RPM, and fan speed actuator 440 automatically selects the maximum control signal input of 4000 RPM, such that the performance control loop "wins". Fan actuator 440 outputs a selected control signal for controlling a fan speed as fan actuation signal 446, throttle actuator 460 outputs one or more control signals for controlling CPU frequency and voltage throttling and memory throttling as throttling actuation signals 462, and ambient temperature voting box 442 outputs a selected control signal for an ambient temperature vote as ambient temperature voting output 448.

Figure 5:
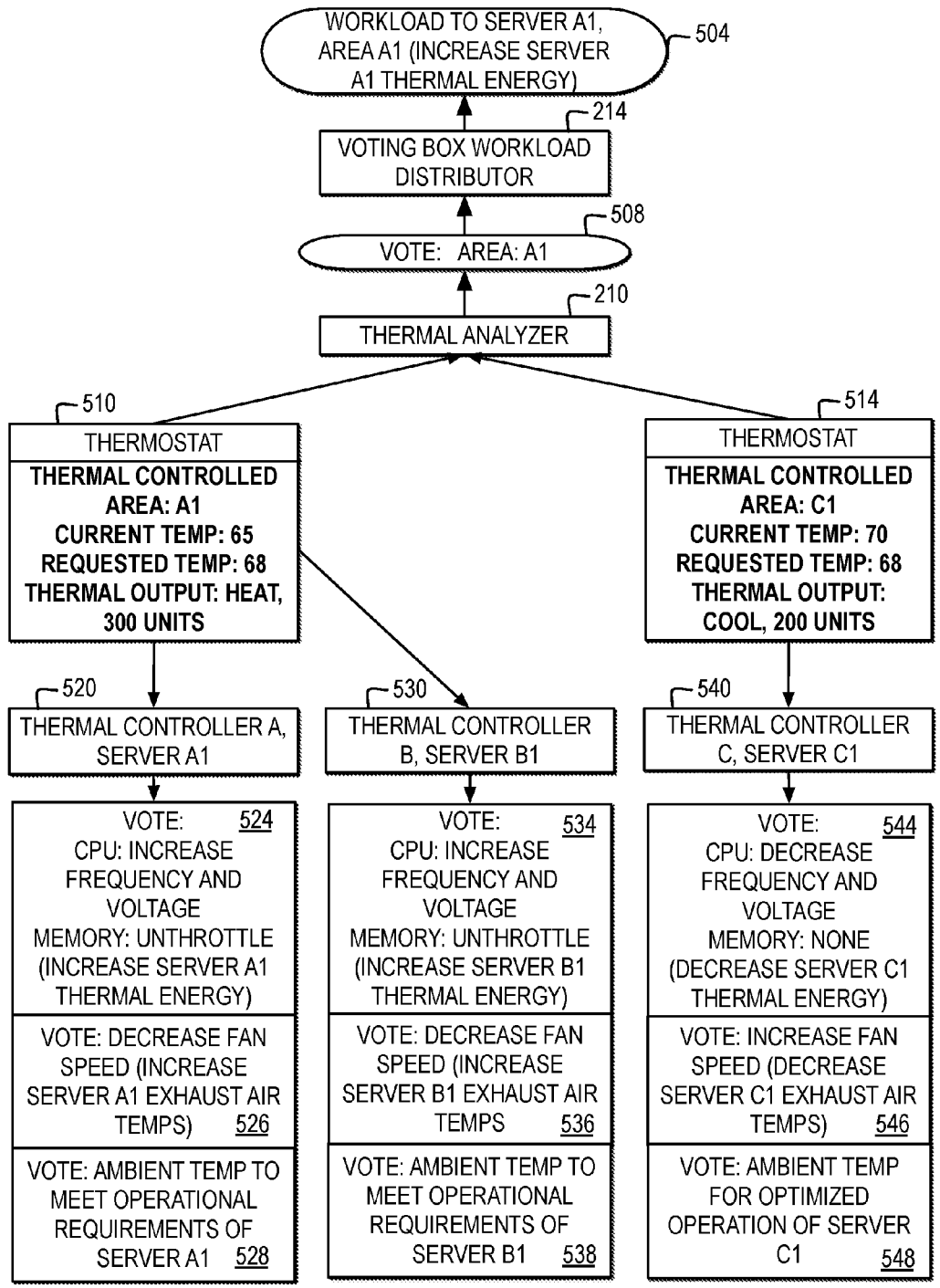
FIG. 5 is a block diagram illustrating one example of a thermal analyzer for managing distribution of workloads to cloud servers to improve thermal heating efficiency and of thermal controllers for locally voting to improve thermal heating efficiency through individual servers.

FIG. 5 illustrates a block diagram of a thermal analyzer for managing distribution of workloads to cloud servers to improve thermal heating efficiency and of thermal controllers for locally voting to improve thermal heating efficiency through individual servers. In the example, a thermostat 510 for a thermal controlled area A1 measures a current temperature of 65 degrees, a requested temperature of 68 degrees, and a thermal output of 300 units of heat. In the example, a thermostat 514 for a thermal controlled area C1 measures a current temperature of 70 degrees, a requested temperature of 68 degrees, and a thermal output of 200 units of cooling. In the example, the thermal output units reported by each thermostat may represent a number of units of energy expended by each thermal control system to control the type of thermal output during a tracked reporting period.

In the example, the thermostats report current temperatures, requested temperatures, and thermal outputs for the thermal controlled areas to a thermal analyzer 210. Thermal analyzer 210 identifies a particular thermal controlled area for which thermal analyzer 210 votes to receive workloads that will yield an increase of the thermal energy of the servers associated with the particular thermal controlled area. In the example, thermal analyzer 210 identifies that among the reports received for thermal controlled areas A1 and C1, thermal controlled area A1 is the most optimal candidate for receiving workloads for increasing the thermal energy output of servers in thermal controlled area A1, as illustrated by the vote at reference numeral 508. In particular, thermal controlled area A1 is the only thermal controlled area reporting a current temperature that is lower than the requested temperature, such that increasing the thermal energy of the server associated with thermal controlled area A1 will increase the heat dissipated by the server for heating the thermal controlled area A1. Voting box workload distributor 214 receives the vote for thermal controlled area A1 and selects a server A1 within thermal controlled area A1 to receive a next workload as illustrated at reference numeral 504, yielding an increase in the thermal energy of server A1, as server A1 executes the workload.

In addition, in the example, along with thermal analyzer 210 selecting to send workloads to the server associated with thermal controlled area A1, a thermal controller A 520 within server A1 also receives the current temperature, requested temperature, and thermal output for thermal controlled area A1, from thermostat 510, and thermal controller A 520 votes on CPU and memory throttling, fan speeds, and ambient temperatures, to optimize the energy use by server A1 and a thermal control system for thermal controlled area A1, to meet the requested temperature. In addition, a thermal controller B 530 within a server B1 also receives the current temperature, requested temperature, and thermal output for thermal controlled area A1, from thermostat 510, and thermal controller B 520 votes on CPU and memory throttling, fan speeds, and ambient temperatures, to optimize the energy use by server B1 and a thermal control system for thermal controlled area A1, to meet the requested temperature. In the example, server A1 and server B1 are associated with the same thermal controlled area A1.

In the example, thermal controller A 520 and thermal controlled B 530 both identify that the current temperature is lower than the requested temperature and vote to adjust the settings of the respective servers A1 and B1 to increase the heat dissipated by each of the servers by increasing the thermal energy and exhaust air temperatures of each server. In the example, thermal controller A 520 votes to increase the thermal energy of server A1 by voting to increase the frequency and voltage output to the CPUs and voting to unthrottle the memory, as illustrated at reference numeral 524, thermal controller A 520 votes to increase the exhaust air temperatures from server A1 by voting to decrease fan speeds, as illustrated at reference numeral 526, and thermal controller A 520 votes for an ambient temperature to meet the optimal operational requirements of server A1, as illustrated at reference numeral 528. Similarly, thermal controller B 530 votes to increase the thermal energy of server B1 by voting to increase the frequency and voltage output to the CPUs and voting to unthrottle memory, as illustrated at reference numeral 534, thermal controller B 530 votes to increase the exhaust air temperatures from server B1 by voting to decrease fan speeds, as illustrated at reference numeral 536, and thermal controller B 530 votes for an ambient temperature to meet the optimal operational requirements of server B1, as illustrated at reference numeral 538. In the example, whether server B1 is handling workloads or idle, server B1 may vote for settings that will still increase the heat dissipation by server B1.

In addition, in the example, even if thermal analyzer 210 votes not to send additional workloads to the server associated with thermal controlled area C1, a thermal controller C 540 within server C1 receives the current temperature, requested temperature, and thermal output for thermal controlled area C1, from thermostat 514, and thermal controller C 540 votes on CPU and memory throttling, fan speeds, and ambient temperatures, to optimize the energy use by server C1 and a thermal control system for thermal controlled area C1, to meet the requested temperature. In the example, thermal controller C 540 identifies that the current temperature is greater than the requested temperature and votes to adjust the settings of server C1 to minimize the heat dissipated by server C1 by decreasing the thermal energy and exhaust air temperatures of server C1. In the example, thermal controller C 540 votes to decrease the thermal energy of server C1 by decreasing the frequency and voltage output to the CPUs and voting for no memory constraints, as illustrated at reference numeral 544, thermal controller C 540 votes to decrease the exhaust air temperatures from server C1 by voting to increase fan speeds, as illustrated at reference numeral 546, and thermal controller C 540 votes for an ambient temperature to meeting the optimal operational requirements of server C1, as illustrated at reference numeral 548.

Figure 6:
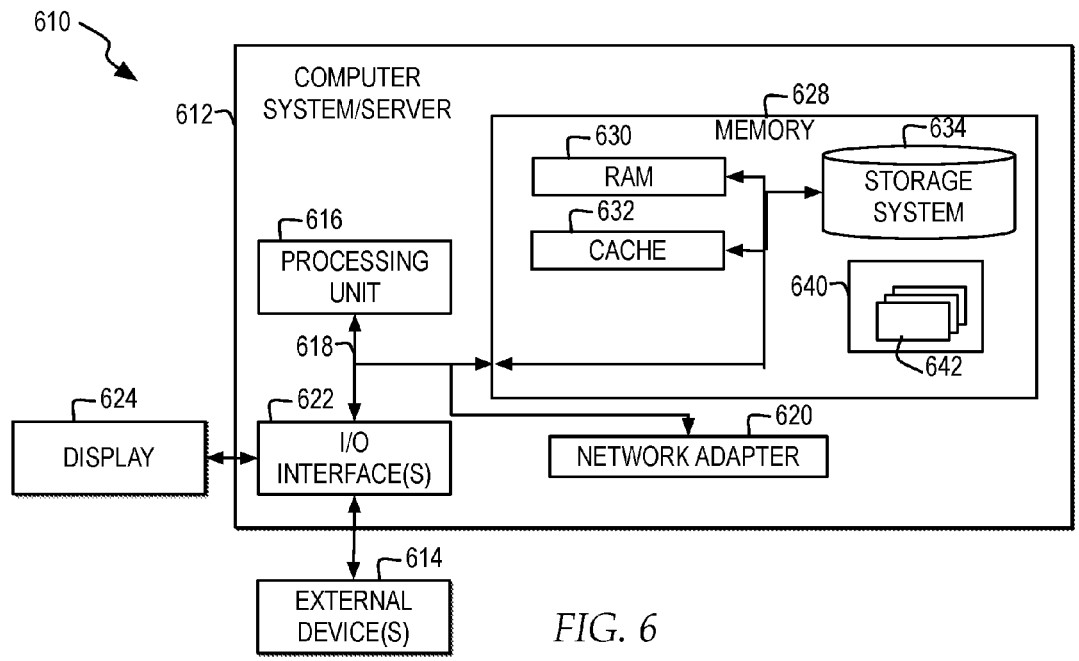
FIG. 6 is block diagram illustrating one example of a schematic of one example of a cloud computing node.

Referring now to FIG. 6, a block diagram illustrates one example of a schematic of one example of a cloud computing node. Cloud computing node 610 is only one example of a cloud computing node and is not intended to suggest any limitation as to the scope of use or functionality of the invention described herein. Regardless, cloud computing node 610 is capable of being implemented and/or performing any of the functionality set forth herein.

It is understood that although this disclosure includes a detailed description on cloud computing, implementation of the teachings recited herein are not limited to a cloud computing environment. Rather, embodiments of the invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: A consumer can unilaterally provision computing capabilities, such as server time and network storage, as needed automatically without requiring human interaction with each service's provider.

Broad network access: Capabilities are available over a network and accessed through standard mechanisms that promote use by heterogeneous thin or thick client platforms (e.g., mobile communication devices, laptops, and tablets).

Resource pooling: The provider's computing resources are pooled to serve multiple consumers using a multi-tenant model, with different physical and virtual resources dynamically assigned and reassigned according to demand. There is a sense of location independence in that the customer generally has no control or knowledge over the exact location of the provided resources but may be able to specify location at a higher level of abstraction (e.g., country, state, or datacenter). Examples of resources include storage, processing, applications, memory, network bandwidth, and virtual machines.

Rapid elasticity: Capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: Cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): The capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): The capability provided to the consumer is to deploy onto the cloud infrastructure consumer-created or acquired applications created using programming languages and tools supported by the provider. The consumer does not manage or control the underlying Cloud infrastructure including networks, servers, operating systems, or storage, but has control over the deployed applications and possibly applications hosting environment configurations.

Infrastructure as a Service (IaaS): The capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: The cloud infrastructure is operated solely for an organization. It may be managed by the organization or a third party and may exist on-premises or off-premises.

Community cloud: The cloud infrastructure is shared by several organizations and supports a specific community that has shared concerns (e.g., mission, security requirements, policy, and compliance considerations). It may be managed by the organizations or a third party and may exist on-premises or off-premises.

Public cloud: The cloud infrastructure is made available to the general public or a large industry group and is owned by an organization selling cloud services.

Hybrid Cloud: The cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability.

In cloud computing node 610, there is a computer system/server 612, which is operational with numerous other general purpose or special purpose computing system environments or configurations. Examples of well-known computing systems, environments, and/or configurations that may be suitable for use with computer system/server 612 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 612 may be described in the general context of computer system-executable instructions, such as program modules, being executed by a computer system. Generally, program modules include routines, programs, objects, components, logic, data structures, and so on that perform particular tasks or implement particular abstract data types. Computer system/server 612 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer system/server 612 in cloud computing node 610 is shown in the form of a general-purpose computing device. The components of computer system/server 612 may include, but are not limited to, one or more processors or processing units 616, a system memory 628, and a bus 618 that couples various system components including system memory 628 to processor 616.

Bus 618 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 612 typically includes a variety of computer system readable media. Such media may be any available media that is accessible by computer system/server 612, and it includes both volatile and non-volatile media, removable and non-removable media.

System memory 628 can include computer system readable media in the form of volatile memory, such as random access memory (RAM) 630 and/or cache memory 632. Computer system/server 612 may further include other removable/non-removable, volatile/non-volatile computer system storage media. By way of example only, a storage system 634 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 618 by one or more data media interfaces. As will be further depicted and described below, memory 628 may include at least one program product having a set (e.g., at least one) of program modules that are configured to carry out the functions of the invention.

Program/utility 640 having a set (at least one) of program modules 642 may be stored in memory 628 by way of example, and not limitation, as well as an operating system, one or more application programs, other program modules, and program data. Each of the operating system, one or more application programs, other program modules, and program data or some combination thereof, may include an implementation of a networking environment. Program modules 642 generally carry out the functions and/or methodologies of the invention as described herein.

Computer system/server 612 may also communicate with one or more external devices 614 such as a keyboard, a pointing device, a display 624, etc.; one or more devices that enable a user to interact with computer system/server 612; and/or any devices (e.g., network card, modem, etc.) that enable computer system/server 612 to communicate with one or more other computing devices. Such communication can occur via I/O interfaces 622. Still yet, computer system/server 612 can communicate with one or more networks such as a local area network (LAN), a general wide area network (WAN), and/or a public network (e.g., the Internet) via network adapter 620. As depicted, network adapter 620 communicates with the other components of computer system/server 612 via bus 618. It should be understood that although not shown, other hardware and/or software components could be used in conjunction with computer system/server 612. Examples, include, but are not limited to: microcode, device drivers, redundant processing units, external disk drive arrays, RAID systems, tape drives, and data archival storage systems, etc.

Figure 7:
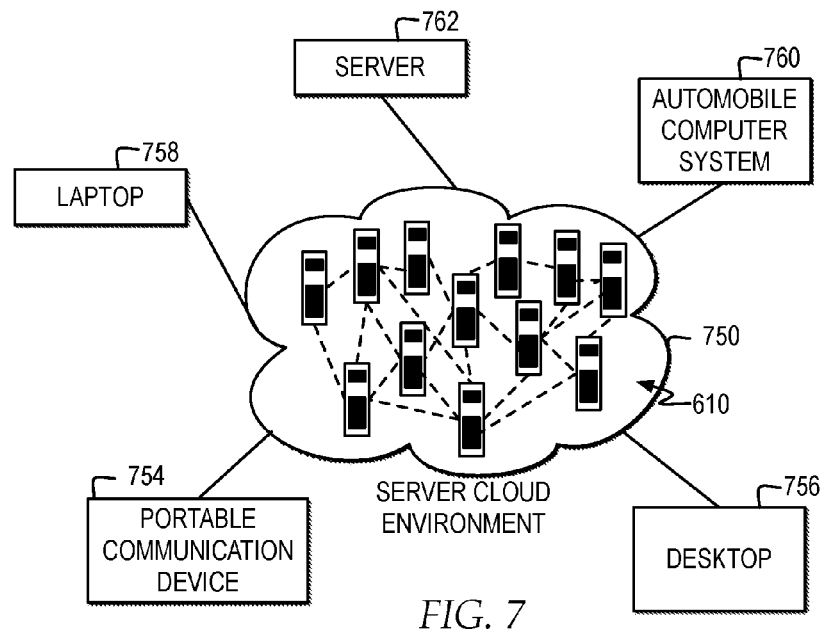
FIG. 7 is a block diagram illustrating a block diagram of one example of a cloud computing environment.

Referring now to FIG. 7, a block diagram illustrates one example of a cloud computing environment. As illustrates, a cloud computing environment 750 comprises one or more cloud computing nodes 610 with which computing devices such as, for example, portable communication device 754, desktop computer 756, laptop computer 758, server 762, and/or automobile computer system 760 communicate. Computing nodes 610 may communicate with one another within cloud computing environment 750 and they may be grouped (not shown) physically or virtually, in one or more networks, such as Private, Community, Public, or Hybrid clouds as described herein, or a combination thereof. This allows cloud computing environment 750 to offer infrastructure, platforms, and/or software as services for which a cloud consumer does not need to maintain resources on a local computing device. It is understood that the types of computing devices 754, 756, 758, 760, and 762 shown in FIG. 7 are intended to be illustrative only and that computing nodes 610 and cloud computing environment 750 can communicate with any type of computerized device over any type of network and/or network/addressable connection (e.g., using a web browser).

Figure 8:
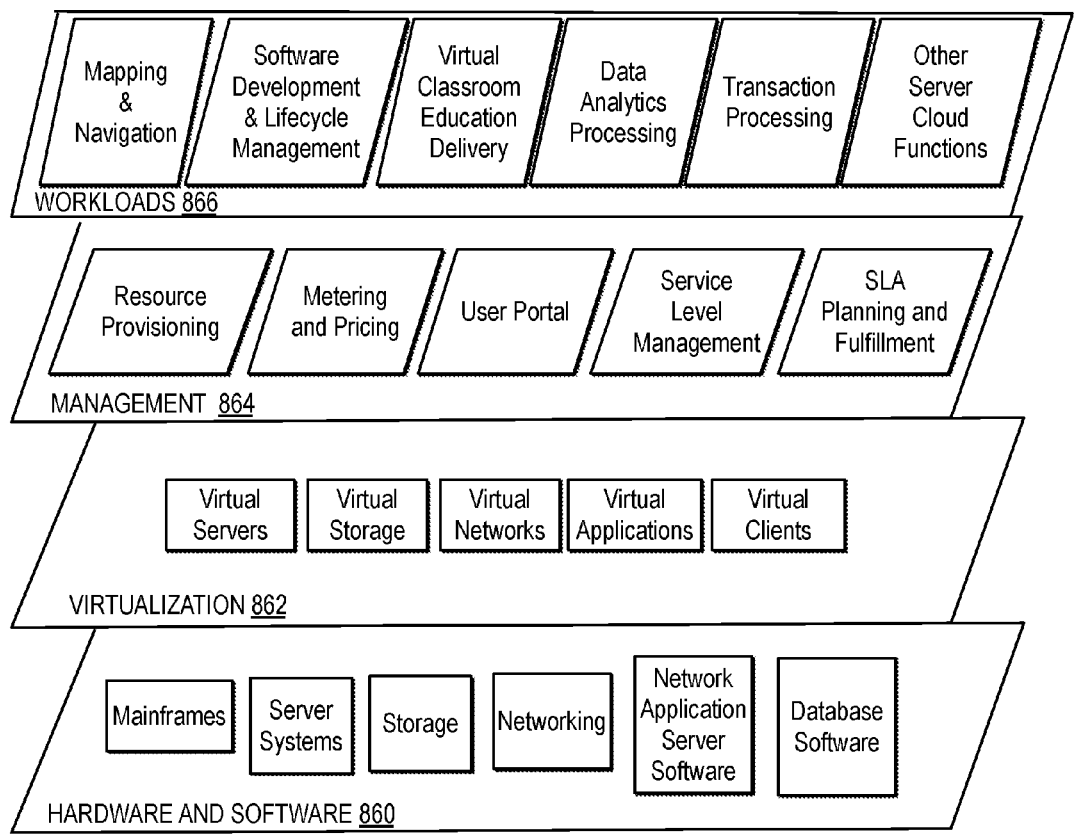
FIG. 8 is a block diagram illustrating a block diagram of a set of functional abstraction layers provided by a cloud computing environment.

Referring now to FIG. 8, a block diagram illustrates a set of functional abstraction layers provided by a cloud computing environment. As illustrated, the components, layers, and functions shown in FIG. 8 are intended to be illustrative only, and the invention is not limited thereto. As depicted, the following layers and corresponding functions are provided:

Hardware and software layer 860 includes hardware and software components. Examples of hardware components include mainframes, in one example, IBM® zSeries® systems; RISC (Reduced Instruction Set Computer) architecture based servers, in one example, IBM pSeries® systems; IBM xSeries® systems; IBM BladeCenter® systems; storage devices; networks, and networking components. Examples of software components include network application server software, in one example, IBM WebSphere® application server software and database software, in one example, IBM DB2® database software. (IBM, zSeries, pSeries, xSeries, BladeCenter, WebSphere, and DB2 are registered trademarks of International Business Machines Corporation.)

Virtualization layer 862 provides an abstraction layer from which the following exemplary virtual entities may be provided: virtual servers; virtual storage; virtual networks, including virtual private networks; virtual applications; and virtual clients.

In one example, management layer 864 provides examples of functionality for which the cloud computing environment is utilized to handle one or more of the functions described with reference to thermal workload distribution controller 150, and in particular thermal analyzer 210, workload analyzer 212, and voting box workload distributor 214, and provides examples of functionality for which the cloud computing environment is utilized to handle one or more functions of thermal control system 302, thermostats, or thermal controllers and may provide the functions described below. Resource provisioning provides dynamic procurement of computing resources and other resources that are utilized to perform tasks within the cloud computing environment. Metering and pricing provide cost tracking as resources are utilized within the cloud computing environment, and billing or invoicing for consumption of these resources. In one example, these resources may comprise application software licenses. Security provides identity verification for users and tasks, as well as protection for data and other resources. User portal provides access to the cloud computing environment for both users and system administrators. Service level management provides cloud computing resource allocation and management such that required service levels are met. Service Level Agreement (SLA) planning and fulfillment provides pre-arrangement for, and procurement of, cloud computing resources for which a future requirement is anticipated in accordance with an SLA.

Workloads layer 866 provides examples of functionality for which the cloud computing environment is utilized for the workloads distributed by voting box workload distributor 214. Examples of workloads and functions which may be provided from this layer include: mapping and navigation; software development and lifecycle management; virtual classroom education delivery; data analytics processing; transaction processing; or any other function available within server cloud 240, which can work in conjunction with one or more of the thermal workload distribution controller functions of management layer 864. As mentioned above, all of the foregoing examples described with respect to FIG. 8 are illustrative only, and the invention is not limited to these examples.

Thermal workload distribution controller 150, thermal control systems, thermal controllers, thermostats, and the functional elements thereof, generally implements the teachings of embodiments of the invention. To this extent, thermal workload distribution, thermal control system, thermal controller, and thermostat functionality can be implemented as hardware, software (e.g., program modules 642 of utility/program 640), or a combination thereof. Regardless, the thermal workload distribution functions, thermal control system functions, thermal controller functions, and thermostat functions of embodiments of the invention will be further described in conjunction with FIGS. 9-13, as well as the illustrative examples previously described.

Figure 9:
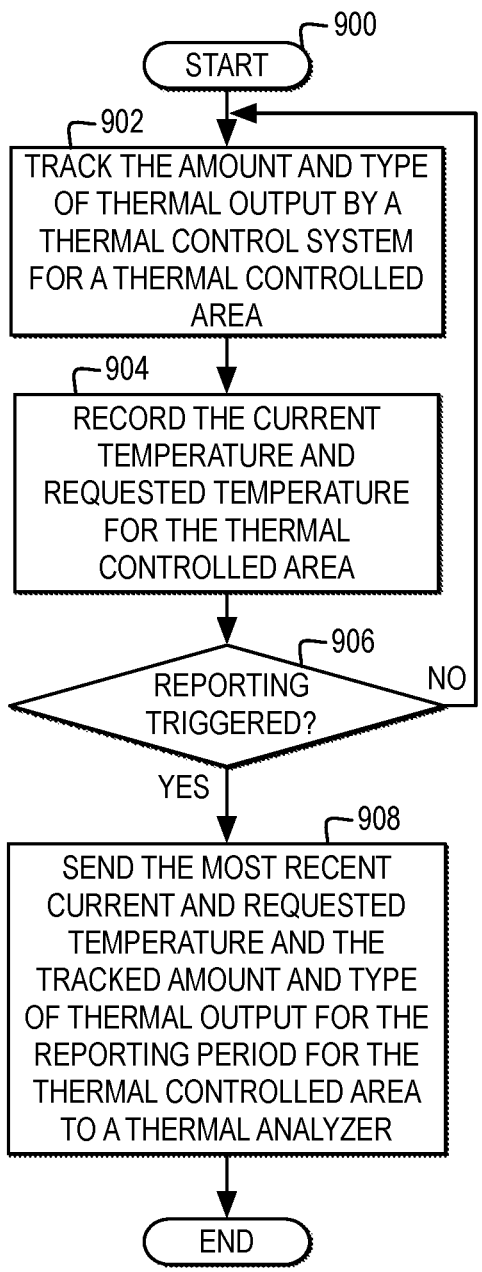
FIG. 9 is a high-level logic flowchart illustrating a process and program for managing a thermostat of a thermal control system for a thermal controlled area.

FIG. 9 illustrates a high-level logic flowchart of a process and program for managing a thermostat of a thermal control system for a thermal controlled area. In the example, the process starts at block 900 and thereafter proceeds to block 902. Block 902 illustrates tracking the amount and type of thermal output by a thermal control system for a thermal controlled area. Next, block 904 illustrates recording the current temperature and the requested temperature for the thermal controlled area. Thereafter, block 906 illustrates a determination whether a report is triggered. A report may be triggered by multiple inputs including, but not limited to, after a particular period of time has passed, after an event occurs, or responsive to a user selection.

If a report is not triggered at block 906, the process returns to block 902 and the thermostat continues to track the thermal output by the thermal control system and record the current temperature and requested temperature for the thermal controlled area. If a report is triggered at block 906, then the process passes to block 908. Block 908 illustrates sending the most recent current temperature and requested temperature and the tracked amount and type of thermal output for the reporting period for the thermal controlled area to a thermal analyzer, and the process ends.

Figure 10:
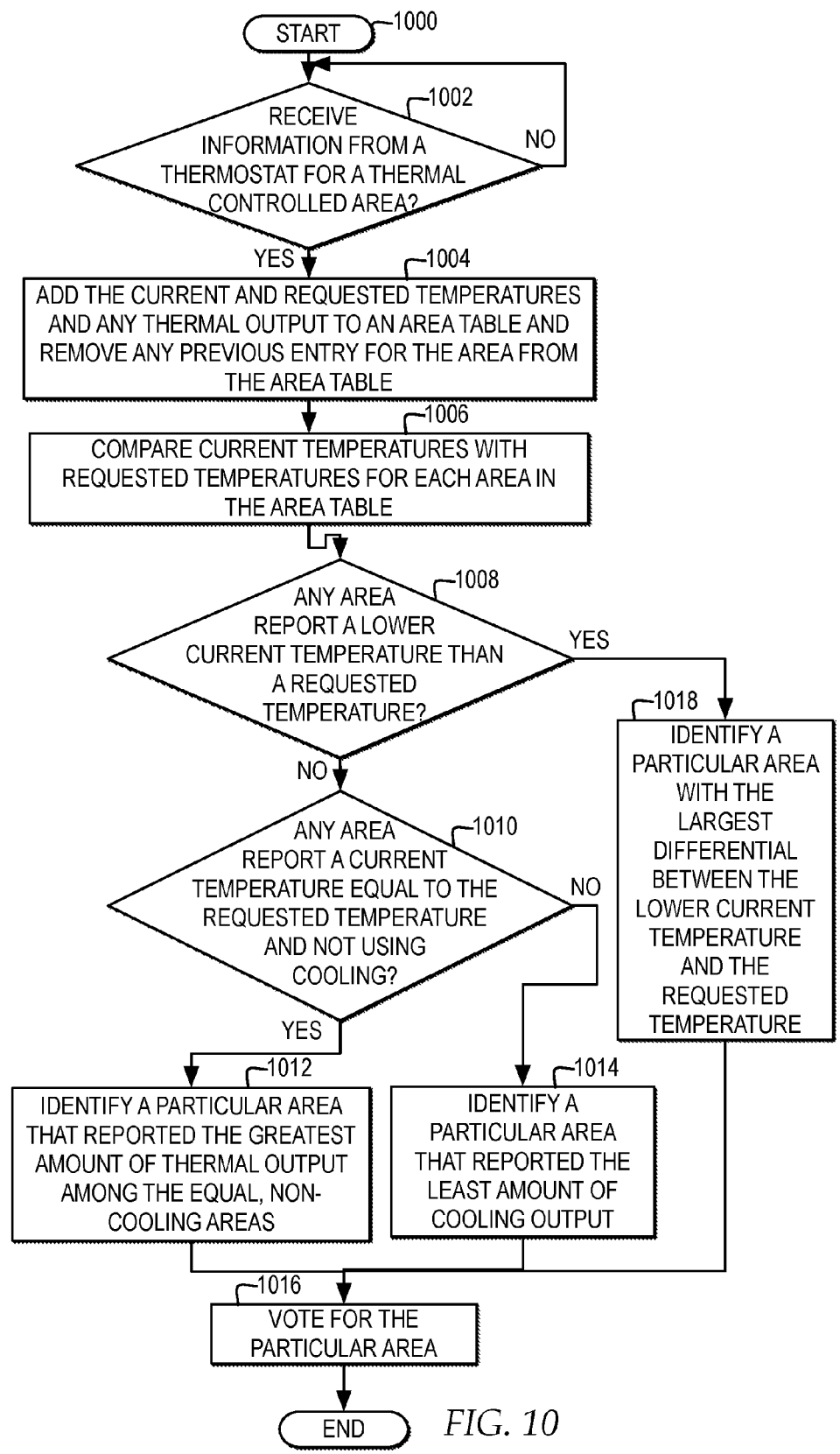
FIG. 10 is a high-level logic flowchart illustrating a process and program for a thermal analyzer selecting a thermal controlled area to vote for to receive a next workload.

FIG. 10 illustrates a high-level logic flowchart of a process and program for a thermal analyzer selecting a thermal controlled area to vote for to receive a next workload. In the example, the process starts at block 1000 and thereafter proceeds to block 1002. Block 1002 illustrates a determination by the thermal analyzer of whether information is received from a thermostat, where the information may include a current temperature of a thermal controlled area, a requested temperature of a thermal controlled area, and the amount and type of output of a thermal control system for managing temperatures in a thermal controlled area. If the thermal analyzer receives information from a thermostat, then the process passes to block 1004. Block 1004 illustrates the thermal analyzer adding the current and requested temperatures and any thermal output to an area table and removing any previous entry for the area from the area table. Next, block 1006 illustrates the thermal analyzer comparing the current temperatures with requested temperatures for each area in the area table, and the process passes to block 1008.

Block 1008 illustrates a determination by the thermal analyzer whether there is any area that reports a lower current temperature than a requested temperature. At block 1008, if there is at least one area that reports a lower current temperature than a requested temperature, then the process passes to block 1018. Block 1018 illustrates the thermal analyzer identifying a particular area with the largest differential between the lower current temperature and the requested temperature. Next, block 1016 illustrates the thermal analyzer voting for the particular area, and the process ends.

Returning to block 1008, if there is not at least one area that reports a lower current temperature than a requested temperature, then the process passes to block 1010. Block 1010 illustrates a determination by the thermal analyzer whether any area reports a current temperature equal to the requested temperature and that has not been using cooling output. At block 1010, if there is at least one area that reports a current temperature equal to the requested temperature and that has not been using cooling output, then the process passes to block 1012. Block 1012 illustrates the thermal analyzer identifying a particular area that reported the greatest amount of thermal output among the equal temperature, non-cooling areas, and the process passes to block 1016.

Returning to block 1010, if there is not at least one area that reports a current temperature equal to the requested temperature and that has not been using cooling output, then the process passes to block 1014. Block 1014 illustrates the thermal analyzer identifying a particular area that reported the least amount of cooling output use, and the process passes to block 1016.

Figure 11:
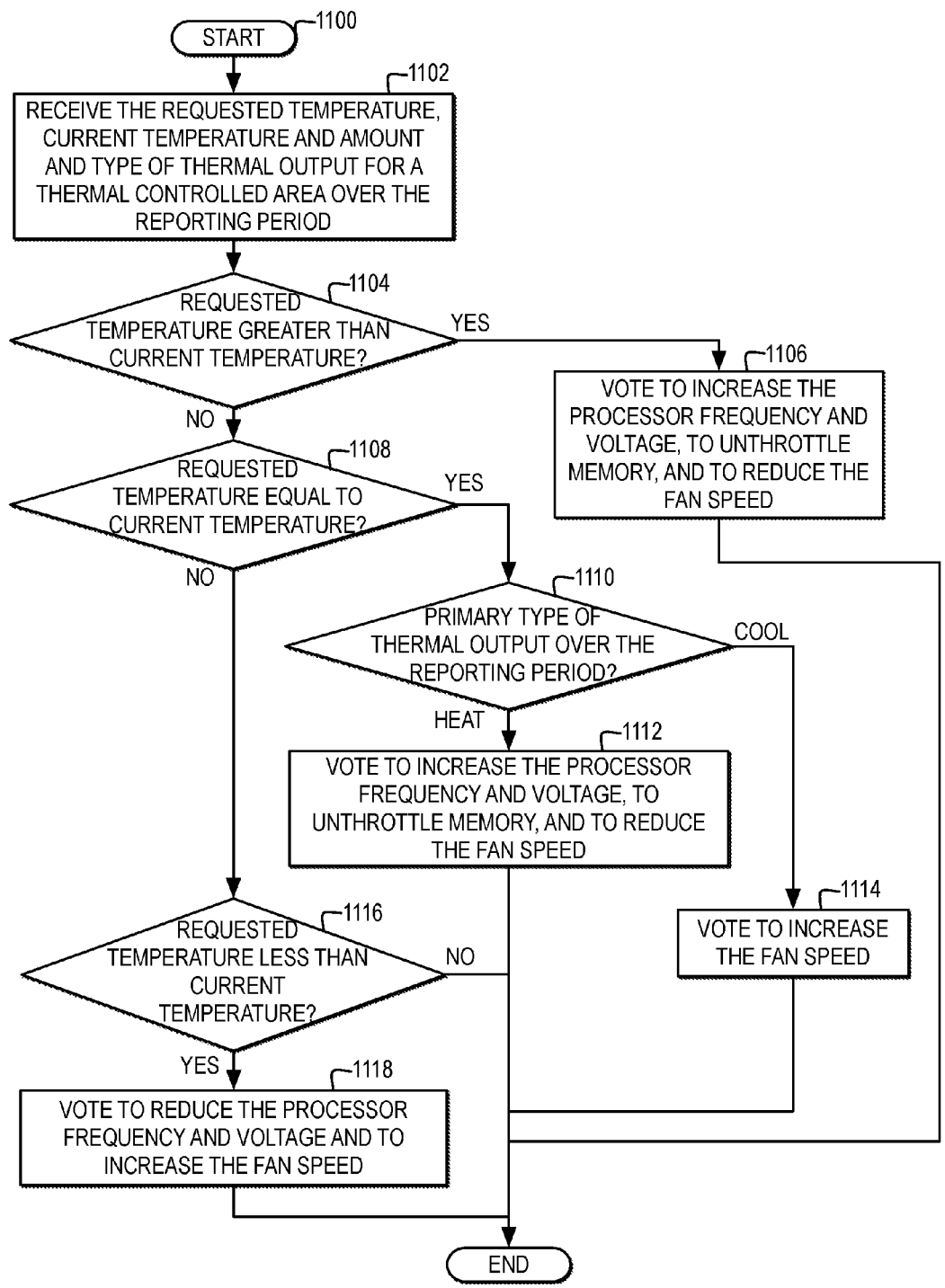
FIG. 11 is a high-level logic flowchart illustrating a process and program for a thermal controller selecting a processor and memory vote and fan speed vote for controlling heat dissipation by a server for a current period.

FIG. 11 illustrates a high-level logic flowchart of a process and program for a thermal controller selecting a processor and memory vote and fan speed vote for controlling heat dissipation by a server for a current period. In the example, the process starts at block 1100 and thereafter proceeds to block 1102. Block 1102 illustrates the thermal controller receiving the requested temperature for a thermal controlled area associated with a server associated with the thermal controller, current temperature for the thermal controlled area, and amount and type of thermal output by a thermal control system for the thermal controlled area over a reporting period, and the process passes to block 1104.

Block 1104 illustrates a determination by the thermal controller whether the requested temperature is greater than the current temperature in the thermal controlled area. If at block 1104 the requested temperature is greater than the current temperature, then the process passes to block 1106. Block 1106 illustrates the thermal controller voting to increase the processor frequency and voltage, to unthrottle memory, and to reduce the fan speed, and the process ends.

Returning to block 1104, if the requested temperature is not greater than the current temperature, then the process passes to block 1108. Block 1108 illustrates a determination by the thermal controller whether the requested temperature is equal to the current temperature. If the requested temperature is equal to the current temperature, then the process passes to block 1110. Block 1110 illustrates a determination by the thermal controller of the primary type of thermal output by the thermal control system over the reporting period. At block 1110, if the primary type of thermal output by the thermal control system was heat, then the process passes to block 1112. Block 1112 illustrates the thermal controller voting to increase the processor frequency and voltage, to unthrottle memory, and to reduce the fan speed, and the process ends. Returning to block 1110, if the primary type of thermal output by the thermal control system was cooling, then the process passes to block 1114. Block 1114 illustrates the thermal controller voting to increase the fan speed, and the process ends.

Returning to block 1108, if the requested temperature is not equal to the current temperature, then the process passes to block 1116. Block 1116 illustrates a determination by the thermal controller whether the requested temperature is less than the current temperature. At block 1116, if the requested temperature is not less than the current temperature, then the process ends. At block 1116, if the requested temperature is less than the current temperature, then the process passes to block 1118. Block 1118 illustrates the thermal controller voting to reduce the processor frequency and voltage and to increase the fan speed, and the process ends.

Figure 12:
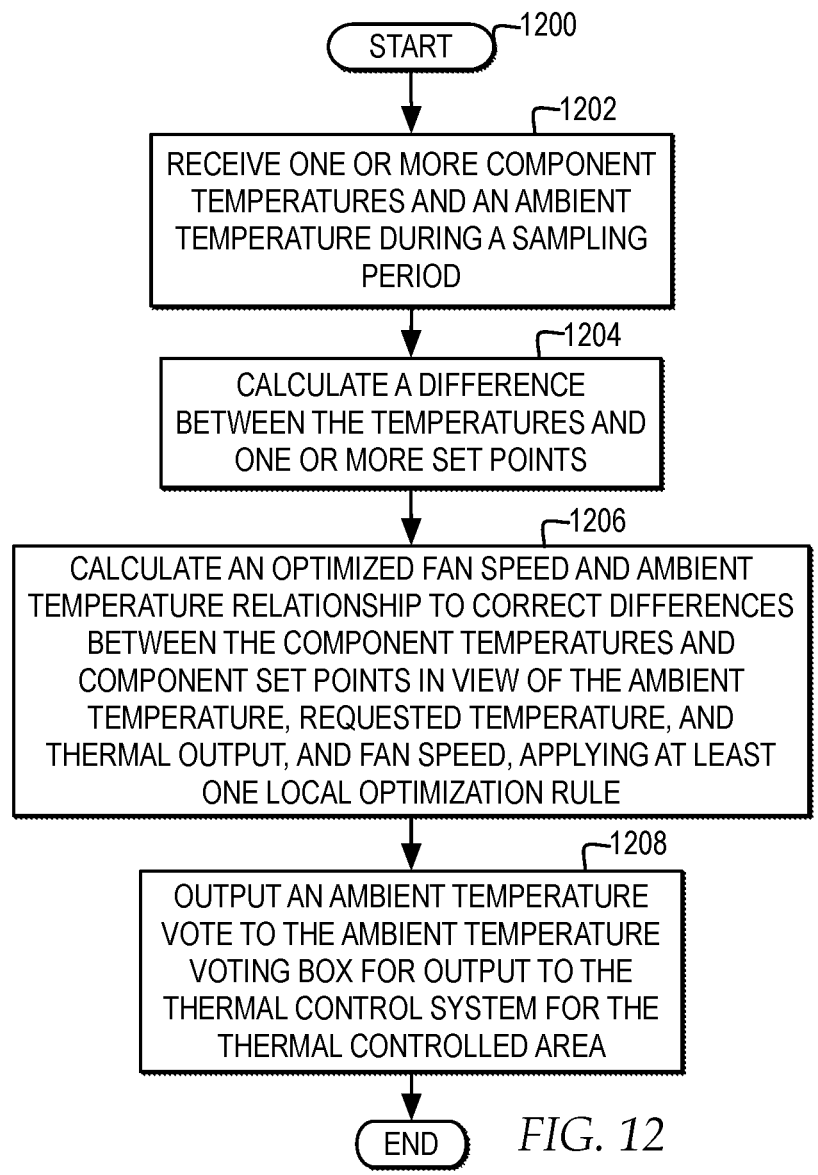
FIG. 12 is a high-level logic flowchart illustrating a process and program for managing a thermal control loop controller of a thermal controller independent of, but integrated with a thermal control system.

FIG. 12 illustrates a high-level logic flowchart of a process and program for managing a thermal control loop controller of a thermal controller independent of, but integrated with a thermal control system. In the example, the process starts at block 1200 and thereafter proceeds to block 1202. Block 1202 illustrates the thermal control loop controller receiving one or more component temperatures and an ambient temperature during a sampling period. Next, block 1204 depicts calculating a difference between the temperatures and one or more set points. Thereafter, block 1206 illustrates calculating an optimized fan speed and ambient temperature relationship to correct differences between the component temperatures and the component set points, in view of the ambient temperature, requested temperature, and thermal output, and fan speed, by applying at least one local optimization rule. Next, block 1208 depicts outputting an ambient temperature vote to the ambient temperature voting box for output to the thermal control system for the thermal controlled area, and the process ends.

Figure 13:
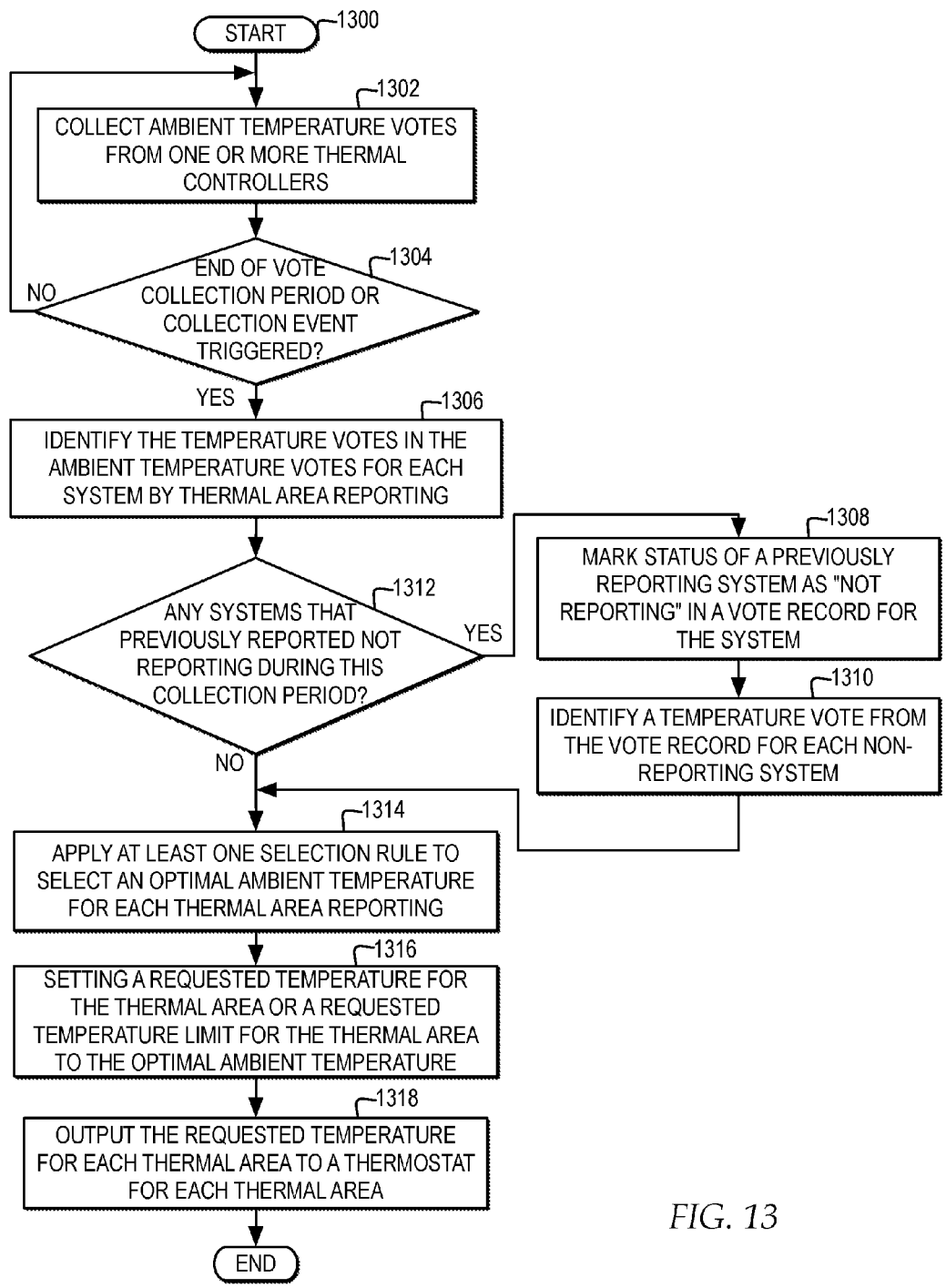
FIG. 13 is a high-level logic flowchart illustrating a process and program for setting an ambient temperature set point for a thermal control system based on ambient temperature votes from independent thermal controllers.

FIG. 13 illustrates a high-level logic flowchart of a process and program for setting an ambient temperature set point for a thermal control system based on ambient temperature votes from independent thermal controllers. In the example, the process starts at block 1300 and thereafter proceeds to block 1302. Block 1302 illustrates collecting ambient temperature votes from one or more thermal controllers during a collection period. Next, block 1304 depicts a determination whether the current collection period has ended or another collection event has been triggered. In one example, a collection event may be triggered if a system that was previously powered off and not reporting ambient temperature votes, reports an ambient temperature vote. If the current collection period has ended, then the process passes to block 1306. Block 1306 illustrates identifying the temperature votes in the ambient temperature votes for each system for each thermal area reporting, and the process passes to block 1312.

Block 1312 depicts a determination whether any systems, which previously reported an ambient temperature vote, are not reporting an ambient temperature vote during this collection period. At block 1312, if any systems that previously reported are not reporting during this collection period, then the process passes to block 1308. Block 1308 depicts marking the status of a previously reporting system as "not reporting" in a vote record of a previous ambient temperature vote. Next, block 1310 illustrates identifying a temperature vote from the vote record for the non-reporting system, and the process passes to block 1314. Returning to block 1312, if all systems are reporting during the reporting period, then the process passes to block 1314.

Block 1314 illustrates applying at least one selection rule to select an optimal ambient temperature from among the current temperature votes for each thermal area reporting.

Next, block 1316 depicts setting a requested temperature for the thermal area to the optimal ambient temperature or setting a requested temperature limit for the thermal area to the optimal ambient temperature. In one example, the requested temperature is set to the optimal ambient temperature when the requested temperature is set for a data center room. In another example, the requested temperature limit is set to the optimal ambient temperature when the requested temperature limit is set for a thermal controlled area associated with servers, but not including servers. Thereafter, block 1318 illustrates outputting the requested temperature or requested temperature limit for each area to a separate thermostat for each thermal area, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method for managing distribution of workloads in a computing environment, comprising:

receiving, by a thermal workload distribution controller, for each of a plurality of thermal controlled areas, at least one current thermal measurement, at least one requested thermal temperature, and a thermal output from at least one separate thermostat node from among a plurality of thermostat nodes via a network;

selecting, by the thermal workload distribution controller, a particular thermal controlled area from among the plurality of thermal controlled areas that is most optimal to receive additional heat, wherein:

if at least one first selection of thermal controlled areas from among the plurality of thermal controlled areas comprises the thermal output set to heat and at least one differential between the at least one requested temperature and the at least one particular current temperature for the at least one first selection of thermal controlled areas, wherein the at least one current temperature is lower than the at least one requested temperature, the particular thermal controlled area is set to a first thermal controlled area, from among the at least one first selection of thermal controlled areas, with a largest differential between the at least one requested temperature and the at least one particular temperature for the at least one first selection of thermal controlled areas; and if at least one second selection of thermal controlled areas from among the plurality of thermal controlled areas comprises the thermal output set to heat and the at least one request temperature equal to the at least one particular current temperature for the at least one second selection of thermal controlled areas, the particular thermal controlled area is set to a second thermal controlled area, from among the at least one second selection of thermal controlled areas, requiring the greatest amount of heating output as specified in the thermal output;

distributing, by the thermal workload distribution controller, at least one workload, from among a plurality of workloads distributed by the thermal workload distribution controller across a plurality of server nodes each associated with one from among the plurality of thermal controlled areas, to at least one server node associated with the particular thermal controlled area from among the plurality of server nodes, wherein the heat dissipated by the at least one server node from executing the workload affects a thermal environment of the particular thermal controlled area;

receiving, by each separate thermal controller separately associated with at least one server node from among the plurality of server nodes, for a separate thermal controlled area from among the plurality of thermal controlled areas, at least one current thermal measurement, at least one requested thermal temperature, and a thermal output from the at least one separate thermostat node from among the plurality of thermostat nodes via a network;

comparing, by each separate thermal controller, the at least one requested thermal temperature with the at least one current thermal measurement;

in response to determining the at least one requested thermal temperature is greater than the at least one current thermal measurement, voting, by each separate thermal controller, to increase a processor frequency and voltage on the at least one server node, to unthrottle memory on the at least one server node, and to reduce the fan speed for the at least one server node;

in response to determining the at least one requested thermal temperature is equal to the at least one current thermal measurement:

if the thermal output is heat, voting, by each separate thermal controller, to increase a processor frequency and voltage on the at least one server node, to unthrottle memory on the at least one server node, and to reduce the fan speed for the at least one server node; and if the thermal output is cool, voting, by each separate thermal controller, to increase the fan speed for the at least one server node; and in response to determining the at least one requested thermal temperature is less than the at least one current thermal measurement, voting, by each separate thermal controller, to reduce the processor frequency and voltage on the at least one server node and to increase the fan speed for the at least one server node.

2. The method according to claim 1, wherein receiving, by a thermal workload distribution controller, for each of a plurality of thermal controlled areas, at least one current thermal measurement, at least one requested thermal temperature, and a thermal output from at least one separate thermostat node via a network, further comprises:

receiving the at least one current thermal measurement, the at least one requested thermal temperature, and the thermal output by a separate thermal control system for providing a heating output from each at least one separate thermostat node.

3. The method according to claim 1, wherein distributing, by the thermal workload distribution controller, at least one workload, from among a plurality of workloads distributed by the thermal workload distribution controller across a plurality of server nodes each associated with one from among the plurality of thermal controlled areas, to at least one server node associated with the particular thermal controlled area from among the plurality of server nodes, wherein the heat dissipated by the at least one server node from executing the workload affects a thermal environment of the particular thermal controlled area, further comprises:

identifying the server node associated with the particular thermal controlled area, wherein the at least one server node operates in a first area outside of the particular thermal controlled area and the heat dissipated by the at least one server node is directed by a data thermal heater into the particular thermal controlled area to maintain the at least one requested temperature for the particular thermal controlled area, wherein the data thermal heater heats the particular thermal controlled area in part through the heat dissipated by the at least one server node, wherein the data thermal heater directs the heat dissipated by the at least one server node to an exterior area if the heat is not required in the particular thermal controlled area.

4. The method according to claim 1, wherein distributing, by the thermal workload distribution controller, at least one workload, from among a plurality of workloads distributed by the thermal workload distribution controller across a plurality of server nodes each associated with one from among the plurality of thermal controlled areas, to at least one server node associated with the particular thermal controlled area from among the plurality of server nodes, wherein the heat dissipated by the at least one server node from executing the workload affects a thermal environment of the particular thermal controlled area, further comprises:

identifying the at least one server node associated with the particular thermal controlled area and operating in the particular thermal controlled area.

5. The method according to claim 1, wherein the thermal workload distribution controller is provided as a management service in a cloud environment.

6. The method according to claim 1, wherein the thermostat node and the server node are provided as virtualized computing nodes in a cloud server environment.

7. The method according to claim 1, wherein the thermal output comprises a type of thermal output of one of cool output and heat output controlled by a thermal control system for the particular thermal controlled area to adjust an ambient air temperature in the particular thermal controlled area.

8. The method according to claim 1, wherein the voting, by each separate thermal controller, comprises sending one or more actuation signals each separately sent to directly control the processor frequency of one or more processors, to directly control throttling of the memory, and to directly control the fan speed of one or more fans of the at least one server node.

9. The method according to claim 1, wherein each separate thermal controller is a separate controller from the thermal workload distribution controller.

\* \* \* \* \*